US012696749B2

(12) United States Patent
Oh et al.

(10) Patent No.: US 12,696,749 B2
(45) Date of Patent: Jul. 28, 2026

(54) INTEGRATED CIRCUIT SEMICONDUCTOR DEVICE

(71) Applicant: SAMSUNG ELECTRONICS CO., LTD., Suwon-si (KR)

(72) Inventors: Seungha Oh, Suwon-si (KR); Jaewon Hwang, Suwon-si (KR); Kwangjin Moon, Suwon-si (KR); Hojin Lee, Suwon-si (KR); Hyungjun Jeon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 330 days.

(21) Appl. No.: 18/199,541

(22) Filed: May 19, 2023

(65) Prior Publication Data

US 2024/0047305 A1     Feb. 8, 2024

(30) Foreign Application Priority Data

Aug. 2, 2022     (KR) ........................ 10-2022-0096271

(51) Int. Cl.
*H10W 20/20*       (2026.01)
*H10D 84/83*       (2025.01)
(Continued)

(52) U.S. Cl.
CPC ............ *H10W 20/20* (2026.01); *H10D 84/83* (2025.01); *H10D 84/834* (2025.01);
(Continued)

(58) Field of Classification Search
CPC . H10W 20/20; H10W 20/023; H10W 20/427; H10W 72/221; H10D 84/83; H10D 84/834
See application file for complete search history.

(56) References Cited

U.S. PATENT DOCUMENTS

| | | | |
|---|---|---|---|
| 6,764,917 B1 * | 7/2004 | Chan ...................... | H10D 86/01 438/149 |
| 8,716,855 B2 * | 5/2014 | Chi ........................ | H10W 72/00 257/E23.079 |

(Continued)

FOREIGN PATENT DOCUMENTS

| | | | | |
|---|---|---|---|---|
| CN | 117790504 A | * | 3/2024 | |
| CN | 120730810 A | * | 9/2025 | .......... H10W 20/427 |

(Continued)

*Primary Examiner* — Laura M Menz
(74) *Attorney, Agent, or Firm* — Muir Patent Law, PLLC

(57) ABSTRACT

An integrated circuit semiconductor device includes a substrate having a first surface and a second surface opposite to the first surface; a power via penetrating between the first surface and the second surface of the substrate; a cell part including a plurality of individual elements having different thicknesses inside the substrate, and a recess positioned between the individual elements; a signal wiring part on the first surface of the substrate and including an upper multilayer wiring layer connected to the power via; a power transmission network part under the second surface of the substrate and including a lower multilayer wiring layer connected to the power via; and an external connection terminal under the power transmission network part and connected to the lower multilayer wiring layer, wherein the substrate includes a plurality of regions having different thicknesses.

20 Claims, 24 Drawing Sheets

(51) Int. Cl.
| | |
|---|---|
| *H10W 20/00* | (2026.01) |
| *H10W 20/41* | (2026.01) |
| *H10W 72/20* | (2026.01) |

(52) U.S. Cl.
CPC ....... *H10W 20/023* (2026.01); *H10W 20/427*
(2026.01); *H10W 72/221* (2026.01); *H10W*
*72/244* (2026.01); *H10W 72/247* (2026.01)

(56) References Cited

U.S. PATENT DOCUMENTS

| | | | | |
|---|---|---|---|---|
| 9,704,827 | B2 * | 7/2017 | Huang | H10W 90/00 |
| 10,325,840 | B2 | 6/2019 | Nelson et al. | |
| 10,325,898 | B2 * | 6/2019 | Deepak | H10D 64/517 |
| 10,700,207 | B2 | 6/2020 | Chen et al. | |
| 10,854,738 | B2 * | 12/2020 | Leipold | H10D 30/0411 |
| 10,892,215 | B2 | 1/2021 | Nelson et al. | |
| 11,145,657 | B1 * | 10/2021 | Or-Bach | H10B 12/37 |
| 12,009,303 | B2 * | 6/2024 | Kim | H10W 20/427 |
| 12,237,268 | B2 * | 2/2025 | Kim | H10W 20/427 |
| 12,341,084 | B2 * | 6/2025 | Lee | H10W 20/20 |
| 12,557,680 | B2 * | 2/2026 | Cha | H10D 30/014 |
| 2006/0087029 | A1 * | 4/2006 | Imanaka | H10W 70/685 |
| | | | | 257/723 |
| 2014/0021584 | A1 * | 1/2014 | Tu | H10W 20/496 |
| | | | | 257/532 |
| 2014/0327109 | A1 * | 11/2014 | Weng | H10D 1/665 |
| | | | | 257/534 |
| 2015/0001738 | A1 * | 1/2015 | Shimizu | H05K 1/115 |
| | | | | 257/778 |
| 2015/0102459 | A1 * | 4/2015 | Lai | H10D 1/692 |
| | | | | 257/532 |
| 2017/0323919 | A1 * | 11/2017 | Kumar | H10F 39/809 |
| 2018/0130786 | A1 * | 5/2018 | Deepak | H10D 64/517 |
| 2021/0020628 | A1 * | 1/2021 | Oh | H10D 88/00 |
| 2021/0305130 | A1 | 9/2021 | Cho et al. | |
| 2021/0408287 | A1 | 12/2021 | Hiblot et al. | |
| 2022/0028848 | A1 * | 1/2022 | Baek | H10W 70/641 |
| 2022/0028915 | A1 * | 1/2022 | Jang | H10F 39/811 |
| 2022/0077062 | A1 | 3/2022 | Van Dal et al. | |
| 2022/0130761 | A1 * | 4/2022 | Kim | H10W 20/427 |
| 2022/0367320 | A1 * | 11/2022 | Lee | H10W 20/20 |
| 2022/0406717 | A1 * | 12/2022 | Lanzillo | H10W 20/427 |
| 2023/0163073 | A1 * | 5/2023 | Son | H10W 20/427 |
| | | | | 257/213 |
| 2023/0307352 | A1 * | 9/2023 | Reshotko | H10W 20/072 |
| 2023/0317619 | A1 * | 10/2023 | Mahajan | H10W 70/611 |
| | | | | 257/776 |
| 2023/0378155 | A1 * | 11/2023 | Park | H10D 89/10 |
| 2024/0047305 | A1 * | 2/2024 | Oh | H10W 20/20 |
| 2024/0047339 | A1 * | 2/2024 | Cha | H10D 30/014 |
| 2024/0105608 | A1 * | 3/2024 | Lanzillo | H10W 20/20 |
| 2024/0105615 | A1 * | 3/2024 | Lee | H10D 30/014 |
| 2024/0234251 | A1 * | 7/2024 | Jeon | H10W 20/20 |
| 2024/0258228 | A1 * | 8/2024 | Park | H10W 20/427 |
| 2024/0290720 | A1 * | 8/2024 | Kim | H10W 20/427 |
| 2024/0290750 | A1 * | 8/2024 | Lee | H10W 74/47 |
| 2024/0413204 | A1 * | 12/2024 | Kim | H10D 64/258 |
| 2025/0038149 | A1 * | 1/2025 | Jeon | H10W 70/65 |
| 2025/0112150 | A1 * | 4/2025 | Jun | H10W 20/43 |
| 2025/0113594 | A1 * | 4/2025 | Komuro | H10D 84/832 |
| 2025/0157930 | A1 * | 5/2025 | Kim | H10W 20/427 |
| 2025/0183158 | A1 * | 6/2025 | Yun | H10W 20/20 |
| 2025/0212525 | A1 * | 6/2025 | Wei | H10D 89/10 |
| 2025/0285969 | A1 * | 9/2025 | Kwak | H10B 12/50 |
| 2025/0299731 | A1 * | 9/2025 | Hwang | G11C 11/2273 |
| 2025/0309115 | A1 * | 10/2025 | D'Silva | H10W 20/427 |
| 2025/0311329 | A1 * | 10/2025 | D'Silva | H10D 62/121 |
| 2025/0329632 | A1 * | 10/2025 | Lee | H10W 20/42 |
| 2025/0331238 | A1 * | 10/2025 | Jeon | H10D 30/6735 |
| 2025/0331305 | A1 * | 10/2025 | Hwang | H10D 84/83 |
| 2025/0344511 | A1 * | 11/2025 | Arkali Radhakrishna | |
| | | | | H10D 89/10 |
| 2025/0359259 | A1 * | 11/2025 | Nam | H10D 64/251 |
| 2025/0359328 | A1 * | 11/2025 | Kim | H10D 30/43 |
| 2026/0052768 | A1 * | 2/2026 | Shin | H10D 84/0151 |
| 2026/0068629 | A1 * | 3/2026 | Choi | H10W 20/42 |

FOREIGN PATENT DOCUMENTS

| | | | | | |
|---|---|---|---|---|---|
| DE | 102015110731 | A1 * | 12/2016 | | H10W 72/00 |
| DE | 102025103963 | A1 * | 10/2025 | | H10W 20/069 |
| EP | 4318592 | A1 * | 2/2024 | | H10F 39/18 |
| EP | 4345905 | A1 * | 4/2024 | | H10W 20/481 |
| EP | 4646057 | A2 * | 11/2025 | | H10W 20/42 |
| JP | 2009252751 | A * | 10/2009 | | |
| KR | 10-2009-0097425 | A | 9/2009 | | |
| KR | 20220056668 | A * | 5/2022 | | H10W 40/10 |
| KR | 20240018251 | A * | 2/2024 | | H10W 20/427 |
| KR | 20240044318 | A * | 4/2024 | | H10W 20/481 |
| KR | 20250153032 | A * | 10/2025 | | H10W 70/68 |
| KR | 20250159573 | A * | 11/2025 | | H10W 20/42 |
| KR | 102924473 | B1 * | 2/2026 | | H10W 72/90 |
| WO | WO-2018057018 | A1 * | 3/2018 | | H10W 20/4484 |

* cited by examiner

INTEGRATED CIRCUIT SEMICONDUCTOR DEVICE

CROSS-REFERENCE TO RELATED APPLICATION

This application is based on and claims priority under 35 U.S.C. § 119 to Korean Patent Application No. 10-2022-0096271, filed on Aug. 2, 2022, in the Korean Intellectual Property Office, the disclosure of which is incorporated by reference herein in its entirety.

BACKGROUND

1. Field

Embodiments relate to an integrated circuit semiconductor device, and more particularly, to an integrated circuit semiconductor device in which power transmission noise and an aspect ratio of vias are improved.

2. Description of the Related Art

As the integrated circuit semiconductor device is highly integrated, power transmission noise may occur. Accordingly, in the integrated circuit semiconductor device, technology for reliably forming vias while decreasing power transmission noise and reducing the width of vias is required.

SUMMARY

The embodiments may be realized by providing an integrated circuit semiconductor device, comprising a substrate having a first surface and a second surface opposite to the first surface, a power via penetrating between the first surface and the second surface of the substrate; a cell part including a plurality of individual elements having different thicknesses inside the substrate, and a recess positioned between the individual elements, a signal wiring part on the first surface of the substrate and including an upper multilayer wiring layer connected to the power via, a power transmission network part under the second surface of the substrate and including a lower multilayer wiring layer connected to the power via, and an external connection terminal under the power transmission network part and connected to the lower multilayer wiring layer, wherein the substrate includes a plurality of regions having different thicknesses.

The embodiments may be realized by providing the integrated circuit semiconductor device wherein the substrate includes a first region in which a first individual element of the cell part is positioned and a second region in which a second individual element of the cell part is positioned, and a thickness of a dopant of the second individual element is greater than a thickness of a dopant of the first individual element.

The embodiments may be realized by providing the integrated circuit semiconductor device as claimed in claim 2, wherein the cell part includes a first recess positioned in the first region and a second recess positioned in the second region, the first region of the substrate has a first thickness from a lower surface of the first recess to the second surface of the substrate and the second region of the substrate has a second thickness from a lower surface of the second recess to the second surface of the substrate, and the first thickness of the first region is greater than the second thickness of the second region.

BRIEF DESCRIPTION OF THE DRAWINGS

Features will become apparent to those of skill in the art by describing in detail exemplary embodiments with reference to the attached drawings in which:

FIG. 1 is a cross-sectional view illustrating an integrated circuit semiconductor device according to embodiments;

FIG. 2 is an enlarged cross-sectional view of the region indicated by "II" of FIG. 1;

FIG. 3 is a cross-sectional view illustrating a power transmission path of an integrated circuit semiconductor device according to an embodiment;

FIG. 4 is a cross-sectional view illustrating an integrated circuit semiconductor device according to embodiments;

FIG. 5 is a cross-sectional view illustrating an integrated circuit semiconductor device according to embodiments;

FIG. 6 is a cross-sectional view illustrating an integrated circuit semiconductor device according to embodiments;

FIG. 7 is a cross-sectional view illustrating an integrated circuit semiconductor device according to embodiments;

FIG. 8 is a cross-sectional view illustrating an integrated circuit semiconductor device according to embodiments;

FIG. 10 is a cross-sectional view illustrating an integrated circuit semiconductor device according to embodiments;

FIG. 11 is a cross-sectional view illustrating an integrated circuit semiconductor device according to embodiments;

FIG. 12 is a cross-sectional view illustrating an integrated circuit semiconductor device according to embodiments; and FIGS. 13A to 13L are cross-sectional views of stages in a method of manufacturing an integrated circuit semiconductor device, according to an embodiment.

DETAILED DESCRIPTION

Figure 1:
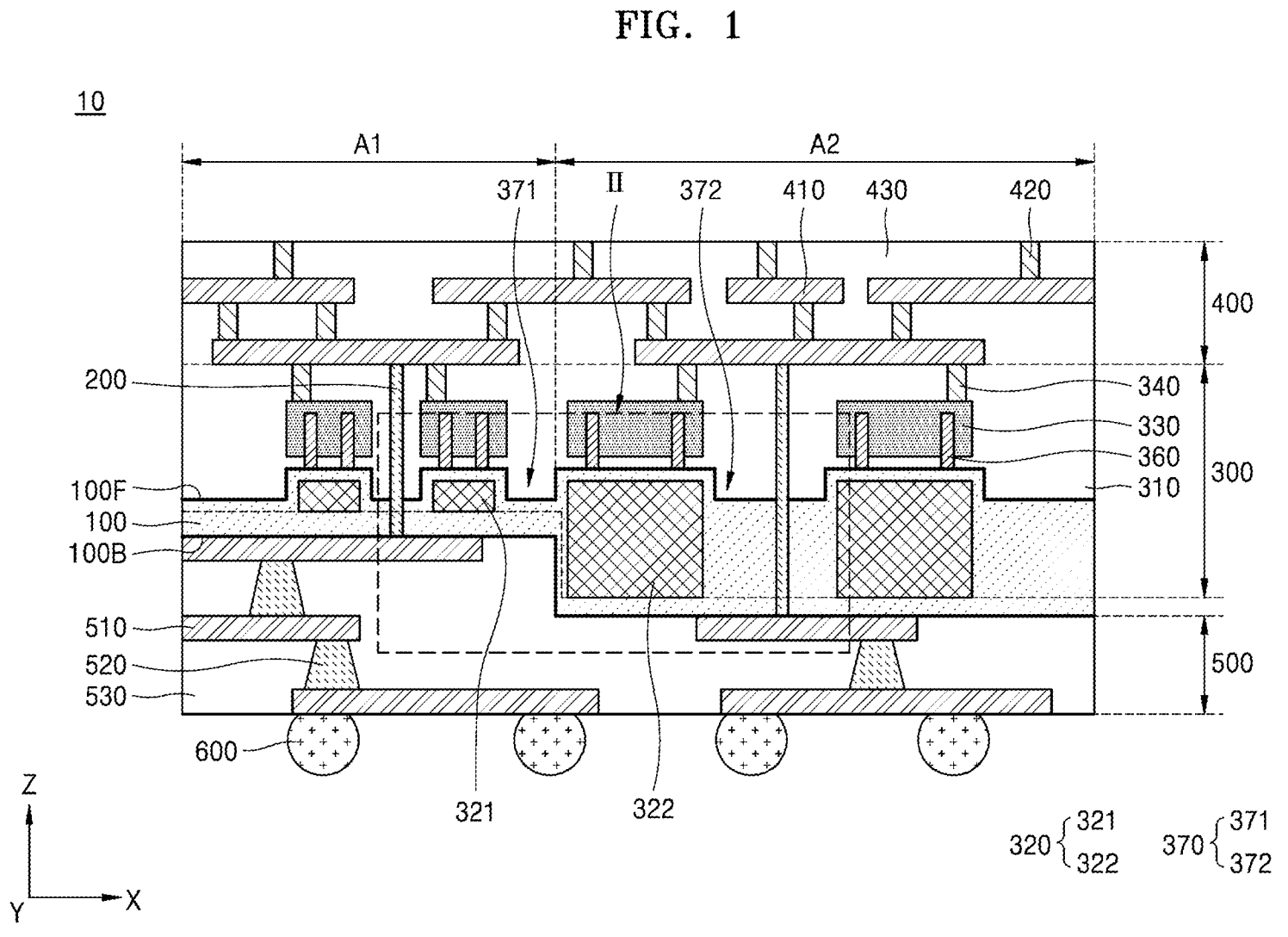
Figure 2:
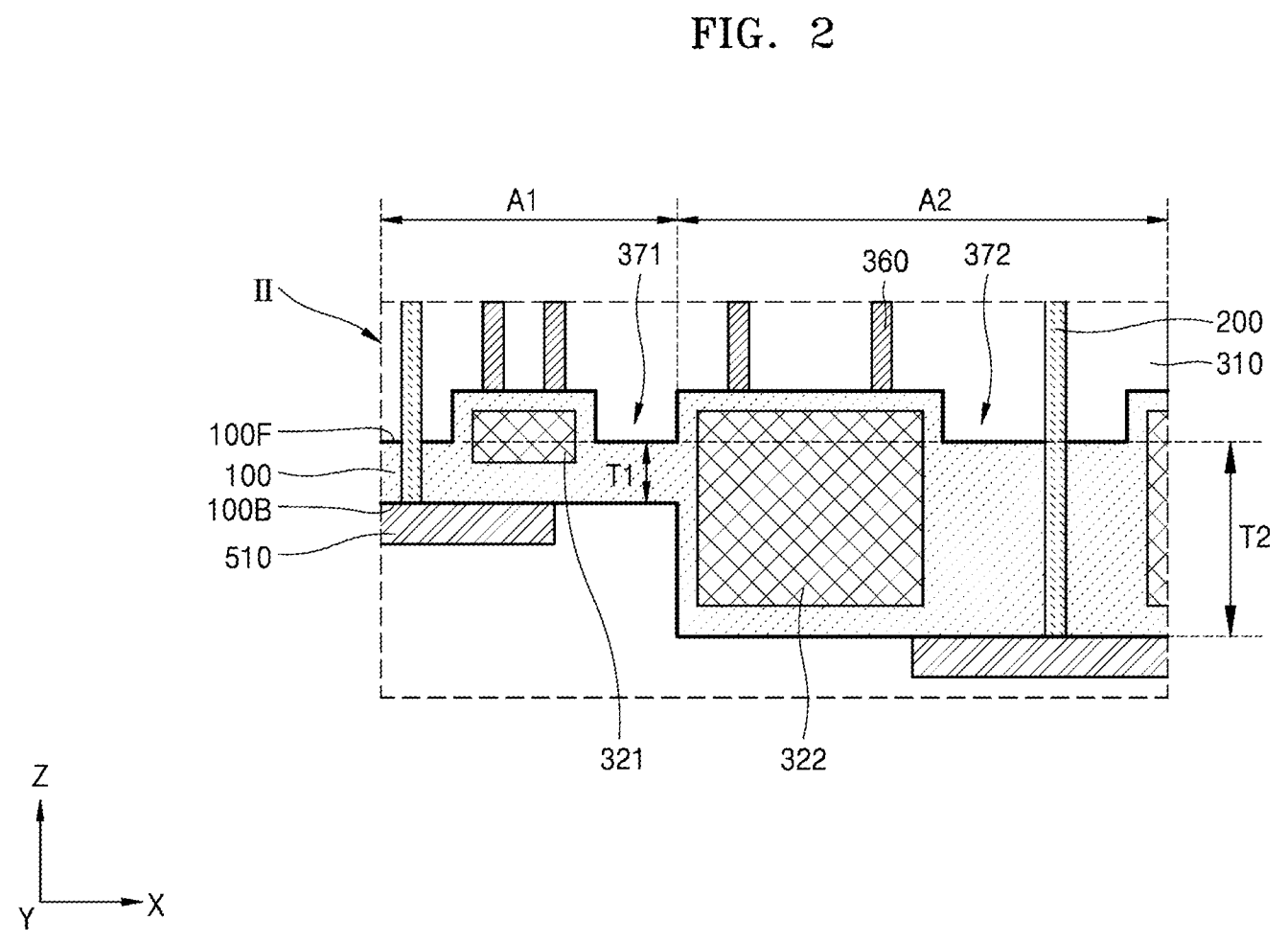
Figure 3:
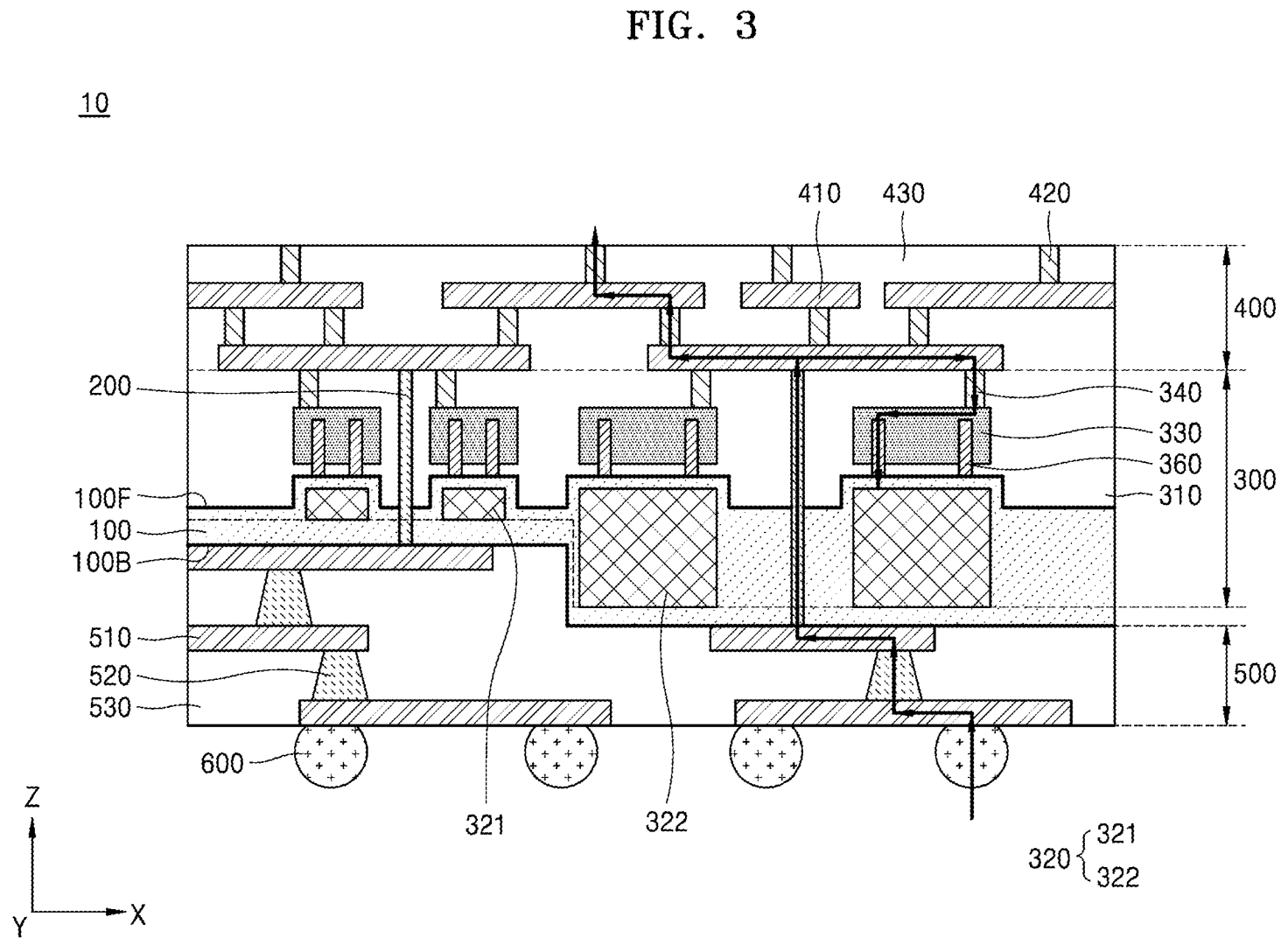
Figure 9:
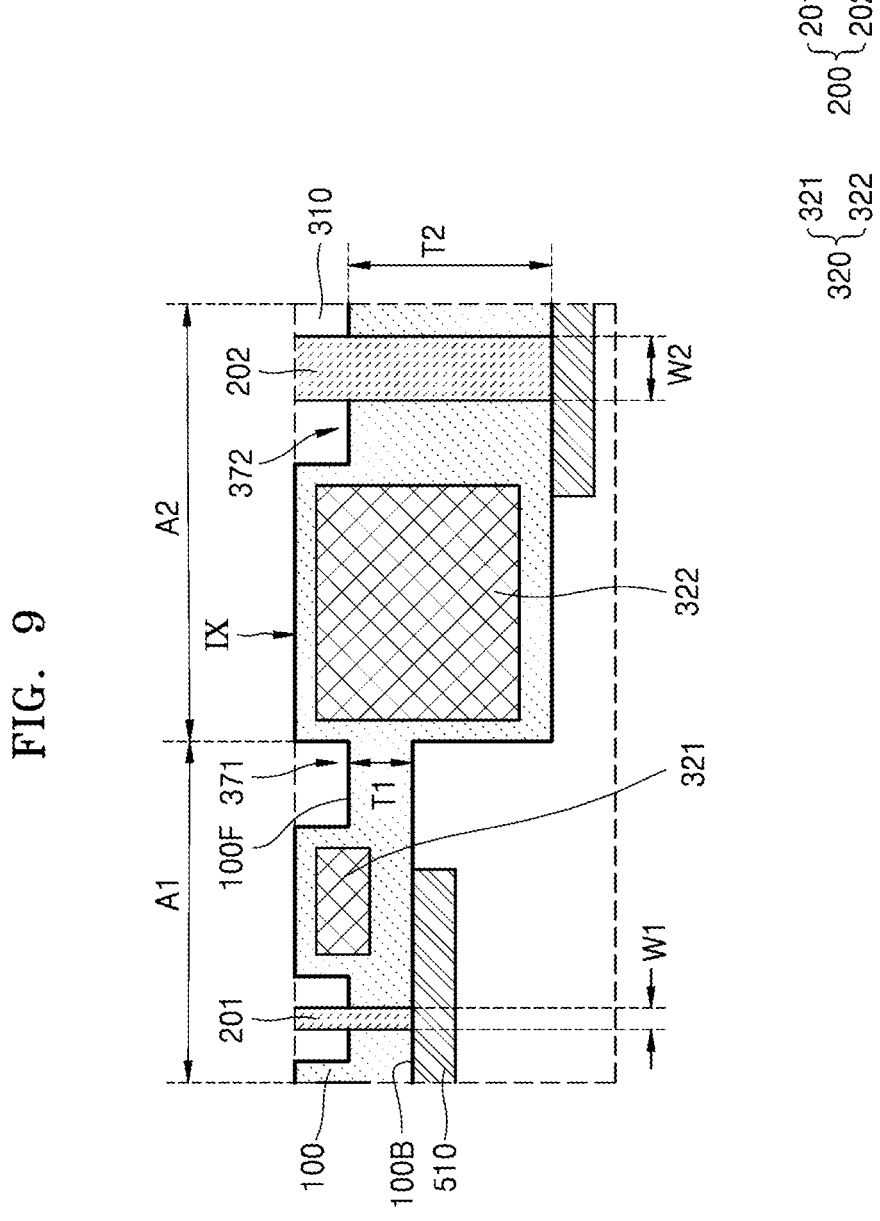
FIG. 9 is an enlarged cross-sectional view of the region indicated by "IX" of FIG. 8.
Figure 9:
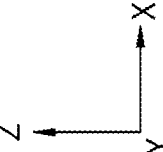

FIG. 1 is a cross-sectional view illustrating an integrated circuit semiconductor device according to embodiments. FIG. 2 is an enlarged cross-sectional view of an area indicated by "II" in FIG. 1. FIG. 3 is a cross-sectional view for explaining a power transmission path of an integrated circuit semiconductor device 10 according to an embodiment.

Referring to FIG. 1, the integrated circuit semiconductor device 10 may include a substrate 100, a power via 200, a cell part 300, a signal wiring part 400, a power transmission network part 500, and an external connection terminal 600.

The substrate 100 may be a silicon substrate. The substrate 100 may include a first surface 100F and a second surface 100B facing the first surface 100F. The first surface 100F of the substrate 100 may be a front-side surface of the substrate 100. The second surface 100B of the substrate 100 may be a backside surface of the substrate 100.

The substrate 100 may have a thickness of several hundred μm or less. In some embodiments, the substrate 100 may have a thickness of several μm. The substrate 100 may include a plurality of regions. In some embodiments, the first surface 100F of the substrate 100 is a plane with no height difference, and in some regions, the thickness of the substrate 100 may be different because the distance between the second surface 100B and the first surface 100F is different. In some embodiments, the substrate 100 may have different thicknesses in a plurality of regions. In some embodiments, some of a plurality of regions may have a first thickness, and other partial regions among the plurality of regions may have a second thickness, wherein the second thickness is different from the first thickness. The substrate 100 will be described later in more detail with reference to FIG. 2.

The power via 200 penetrating between the first surface 100F and the second surface 100B of the substrate 100 may be positioned on the substrate 100. The power via 200 may be electrically connected to the signal wiring part 400. The power via 200 may be electrically connected to the power transmission network part 500. That is, the power via 200 may protrude above the first surface 100F of the substrate 100 and be electrically connected to an upper multilayer wiring layer 410 of the signal wiring part 400. In addition, the power via 200 may protrude below the second surface 100B of the substrate 100 and be electrically connected to the power transmission network part 500. The power via 200 may be referred to as a through silicon via or a rail conductive via.

The power via 200 may include a pillar-shaped conductive plug and a conductive barrier layer disposed on an outer surface of the conductive plug. For example, the conductive plug may include copper (Cu), nickel (Ni), gold (Au), silver (Ag), tungsten (W), titanium (Ti), tantalum (Ta), indium (In), molybdenum (Mo), manganese (Mn), Among cobalt (Co), tin (Sn), magnesium (Mg), rhenium (Re), beryllium (Be), gallium (Ga), or ruthenium (Ru). The conductive barrier layer may include titanium (Ti), titanium nitride (TiN), tantalum (Ta), tantalum nitride (TaN), tungsten (W), tungsten nitride (WN), ruthenium (Ru), or cobalt (Co). The conductive plug and the conductive barrier layer may be formed by, for example, a physical vapor deposition (PVD) process or a chemical vapor deposition (CVD) process. As used herein, the term "or" is not an exclusive term, e.g., "A or B" would include A, B, or A and B.

The cell part 300 may be positioned on the first surface 100F of the substrate 100. The cell part 300 may include an insulating layer 310, a plurality of individual elements 320, a local interconnect connected to the individual elements 320, a cell via 340, and a recess 370. The cell part 300 may be a structure manufactured by a front end of line (FEOL) process.

The insulating layer 310 of the cell part 300 may be disposed on the first surface 100F of the substrate 100. The insulating layer 310 may include a plurality of interlayer insulating layers sequentially stacked on the first surface 100F of the substrate 100.

In some embodiments, the insulating layer 310 may include an oxide and/or a nitride. For example, the insulating layer 310 may include silicon oxide and/or silicon nitride. In example embodiments, the insulating layer 310 may include an insulating material made of a photo imageable dielectric (PID) material on which photolithography process may be performed. For example, the insulating layer 310 may include photosensitive polyimide (PSPI).

The individual elements 320 of the cell part 300 may be provided in the substrate 100 or may be provided on the first surface 100F of the substrate 100. The individual elements 320 may include, for example, a transistor. The individual elements 320 may include microelectronic devices, such as a metal-oxide-semiconductor field effect transistor (MOSFET), a system large scale integration (LSI), an image sensor, such as CMOS imaging sensor (CIS), a micro-electro-mechanical system (MEMS), an active device, a passive device, and the like. The individual elements 320 may be electrically connected to the conductive region of the substrate 100. Each of the individual elements 320 may be electrically isolated from other adjacent individual elements 320 by the insulating layer 310. The thicknesses of the plurality of individual elements 320 may be different from each other.

The local interconnect 330 of the cell part 300 may be connected to the cell via 340 formed in the insulating layer 310. The cell via 340 may be connected to the upper multilayer wiring layer 410 positioned at the bottom of the upper multilayer wiring layers 410. Although the active fin 360 constituting the transistor TR is illustrated in FIG. 1 embodiments are not limited thereto, and the cell part 300 may include a nanosheet or the like. The local interconnect 330 may be formed to surround a portion of the upper portion of the active fin 360.

The recess 370 of the cell part 300 may be formed between the individual elements 320. The recess 370 may be filled with an insulating layer 310. A short circuit between the individual elements 320 may be prevented due to the recess 370.

The signal wiring part 400 may be located on the first surface 100F of the substrate 100. The signal wiring part 400 may be located on the cell part 300. The signal wiring part 400 may be disposed on the insulating layer 310 of the cell part 300. The signal wiring part 400 may include a structure manufactured by a back end of line (BEOL) process. An area occupied by the signal wiring part 400 may be the same as an area occupied by the cell part 300 and the substrate 100.

The signal wiring part 400 may include an upper conductive wiring pattern and an upper wiring insulating layer 430. The upper conductive wiring pattern of the signal wiring part 400 may include an upper multilayer wiring layer 410 and a plurality of upper vias 420.

The upper multilayer wiring layer 410 may be covered by the upper wiring insulating layer 430. The upper multilayer wiring layer 410 may each extend in the horizontal direction (e.g., the X direction and/or the Y direction) within the upper wiring insulating layer 430. The upper multilayer wiring layer 410 may be positioned at different levels in the vertical direction (e.g., Z direction) within the upper wiring insulating layer 430 to form a multilayer wiring structure. In FIG. 1, the plurality of upper multilayer wiring layers 410 are illustrated as having a two-layer structure, but this is only an example. In some implementations, the upper multilayer wiring layer 410 may be formed to have a structure of three or more layers.

The plurality of upper vias 420 may extend between the plurality of upper multilayer wiring layers 410 positioned at different vertical levels to electrically connect between the plurality of upper multilayer wiring layers 410 positioned at different vertical levels.

A wiring layer closest to the insulating layer 310 among the upper multilayer wiring layers 410 may be connected to the power via 200. The signal wiring part 400 may transmit a signal to a plurality of individual elements 320 of the cell part 300. The upper multilayer wiring layer 410 and the plurality of upper vias 420 may include, e.g., a metal, such as copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), ruthenium (Ru), or the like, or an alloy thereof.

The upper wiring insulating layer 430 may include a plurality of interlayer insulating layers sequentially stacked on the insulating layer 310. In example embodiments, the upper wiring insulating layer 430 may include oxide and/or nitride. For example, the upper wiring insulating layer 430 may include silicon oxide and/or silicon nitride. In example embodiments, the upper wiring insulating layer 430 may include an insulating material made of a PID material on which a photolithography process may be performed. For example, the upper wiring insulating layer 430 may include PSPI.

The power transmission network part 500 may be disposed under the second surface 100B of the substrate 100. The power transmission network part 500 may include a structure manufactured by a BEOL process. An area occupied by the power transmission network part 500 may be the same as an area occupied by the substrate 100.

The power transmission network part 500 may include a lower conductive wiring pattern and a lower wiring insulating layer 530. The lower conductive wiring pattern of the power transmission network part 500 may include a lower multilayer wiring layer 510 and a plurality of lower vias 520.

The lower multilayer wiring layer 510 may be covered by the lower wiring insulating layer 530. The lower multilayer wiring layers 510 may each extend in the horizontal direction (e.g., the X direction and/or the Y direction) within the lower wiring insulating layer 530. The lower multilayer wiring layer 510 may be positioned at different levels in the vertical direction (e.g., Z direction) within the lower wiring insulating layer 530 to form a multilayer wiring structure. In FIG. 1, the lower multilayer wiring layer 510 is illustrated as having a two-layer structure, but this is only an example, and the lower multilayer wiring layer 510 may be formed to have a structure of three or more layers.

The plurality of lower vias 520 may extend between the lower multilayer wiring layers 510 positioned at different vertical levels to electrically connect the lower multilayer wiring layers 510 positioned at different vertical levels to one another.

In example embodiments, the horizontal width of each lower via 520 may gradually decrease toward the second surface 100B of the substrate 100. That is, each lower via 520 may have a tapered shape in which a horizontal width thereof narrows toward the second surface 100B of the substrate 100.

The lower multilayer wiring layer 510 and the plurality of lower vias 520 may include, for example, a metal, such as copper (Cu), aluminum (Al), tungsten (W), titanium (Ti), tantalum (Ta), indium (In), molybdenum (Mo), manganese (Mn), cobalt (Co), tin (Sn), Nickel (Ni), magnesium (Mg), rhenium (Re), beryllium (Be), gallium (Ga), ruthenium (Ru), and the like, or an alloy thereof.

The lower wiring insulating layer 530 may include a plurality of interlayer insulating layers sequentially stacked on the second surface 100B of the substrate 100. In example embodiments, the lower wiring insulating layer 530 may include oxide and/or nitride. For example, the lower wiring insulating layer 530 may include silicon oxide and/or silicon nitride. In example embodiments, the lower wiring insulating layer 530 may include an insulating material made of a PID material on which a photolithography process may be performed. For example, the lower wiring insulating layer 530 may include PSPI.

The external connection terminal 600 connected to the lower multilayer wiring layer 510 may be positioned below the power transmission network part 500. The external connection terminal 600 may be a solder ball.

The integrated circuit semiconductor device 10 configured as described above may constitute the cell part 300 and the signal wiring part 400 on the first surface 100F of the substrate 100, and may provide the power transmission network part 500 under the second surface 100B of the substrate 100. The integrated circuit semiconductor device 10 may reduce power transmission noise by separating the signal wiring part 400 and the power transmission network part 500.

Referring to FIGS. 1 and 2, the substrate 100 may include a plurality of regions A1 and A2 having different thicknesses. The cell part 300 may include individual elements 320 having different heights.

In some embodiments, the first region A1 of the cell part 300 may include a first individual element 321, an active fin 360, a first recess 371, and a local interconnect 330. The first region A1 of the cell part 300 may include a planar FET, a Fin FET, a GAA FET, an MBC FET, or the like. In one embodiment, the local interconnect 330 of the first region A1 may be a gate, and the first individual element 321 may be a transistor connected to the gate through the active fin 360. In this case, the first individual element 321 may include a source region, a drain region, a gate, and a channel formed on the active fin 360. In some embodiments, the first individual element 321 may be doped with a P-type dopant or an N-type dopant.

In some embodiments, the second region A2 of the cell part 300 may include a second individual element 322, an active fin 360, a second recess 372, and a local interconnect 330. The second region A2 of the cell part 300 may include a planar FET, a Fin FET, a GAA FET, an MBC FET, and the like. In one embodiment, the second individual element 322 may be doped with a P-type dopant or an N-type dopant. A dopant thickness of the second individual element 322 may be greater than a dopant thickness of the first individual element 321. That is, the doped region of the second individual element 322 may be thicker than the doped region of the first individual element 321.

In some embodiments, the cell part 300 may include a first individual element 321 and a second individual element 322. A region of the substrate 100, in which the first individual element 321 of the cell part 300 is located, may be referred to as a first region A1. A region of the substrate 100, in which the second individual element 322 of the cell part 300 is located, may be referred to as a second region A2. The thickness of the dopant of the second individual element 322 may be greater than the thickness of the dopant of the first individual element 321. That is, a thickness doped in the second region A2 may be greater than a thickness doped in the first region A1.

In some embodiments, the cell part 300 may include a first recess 371 positioned in the first region A1 of the substrate 100. The substrate 100 may have a first thickness T1 from the lower surface of the first recess 371 to the second surface 100B of the substrate 100 in the first region A1. The cell part 300 may include a second recess 372 positioned in the second region A2 of the substrate 100. In the substrate 100, a length from the lower surface of the second recess 372 to the second surface 100B of the substrate 100 in the second region A2 may be a second thickness T2. The first thickness T1 of the first region A1 may be less than the second thickness T2 of the second region A2.

In some embodiments, the first thickness T1 of the first region A1 of the substrate 100 may be about 100 nm to about 350 nm. The first thickness T1 of the first region A1 may be equal to or greater than the thickness of the first individual element 321. The second thickness T2 of the second region A2 of the substrate 100 may be greater than the first thickness T1 of the first region A1 by about 100 nm or more. The second thickness T2 of the second region A2 may be equal to or greater than the thickness of the second individual element 322.

In some embodiments, the first individual element 321 of the cell part 300 may be disposed in the active fin 360. In the region where the active fin 360 including the first individual element 321 is located, the thickness of the substrate 100 may be several nm. Alternatively, when the substrate 100 is completely removed, the active fin 360 including the first individual element 321 may contact the lower insulating layer 530 or the lower multilayer wiring layer 510 from the lower surface of the active fin 360.

The power via 200 penetrating through the substrate 100 and extending to the upper multilayer wiring layer 410 of the signal wiring part 400 may be formed through a via process. If the aspect ratio of a via is increased, the difficulty of the process of forming a via may increase. For example, if the thickness of the substrate 100 is about 600 nm or more, it may be difficult for the via process to greatly increased, such that it may be difficult to form the via. For example, if the substrate 100 including both an individual element having a thickness exceeding 600 nm and an individual element having a thickness less than that, the thickness of the substrate 100 may be increased to 600 nm or more, such that the process difficulty of forming the power via 200 may be greatly increased. In embodiments, the thickness of the substrate 100 may be small in the region of the substrate 100 where individual elements with a small thickness are located, and the aspect ratio of the via may be lowered, thereby reducing the difficulty of the process. In some embodiments, a region in which a core individual element is positioned may have a small pitch and a small margin, such that the width of the power via may be reduced of forming the via. Thus, the aspect ratio of the via may be increased. By partially reducing the thickness of a substrate in the region where the core individual element is located, the aspect ratio of the via may be lowered.

Referring to FIG. 3, the power input to the external connection terminal 600 may be sequentially transmitted to the power via 200 through the lower multilayer wiring layer 510. The lower via 520 of the power transmission network part 500 may be transmitted to the upper multilayer wiring layer 410 of the signal wiring part 400 through the power via 200, and may be transmitted to the cell via 340 and the local interconnect 330 of the cell part 300 through the upper multilayer wiring layer 410, and may be transmitted to the individual elements 320 through the local interconnect 330. In addition, power transmitted to the signal wiring part 400 may be transmitted to the upper multilayer wiring layer 410 of the next vertical level through the upper via 420. The power transmission network part 500 may be positioned under the second surface 100B of the substrate 100 to transmit power from the lower portion to the upper portion of the substrate 100. The first side 100F of the substrate 100 may transmit a signal through the signal wiring part 400, and the second side 100B of the substrate 100 may transmit power through the power transmission network part 500 such that that power transmission noise may be reduced.

FIGS. 4 to 7 are cross-sectional views illustrating integrated circuit semiconductor devices according to embodiments.

Figure 4:
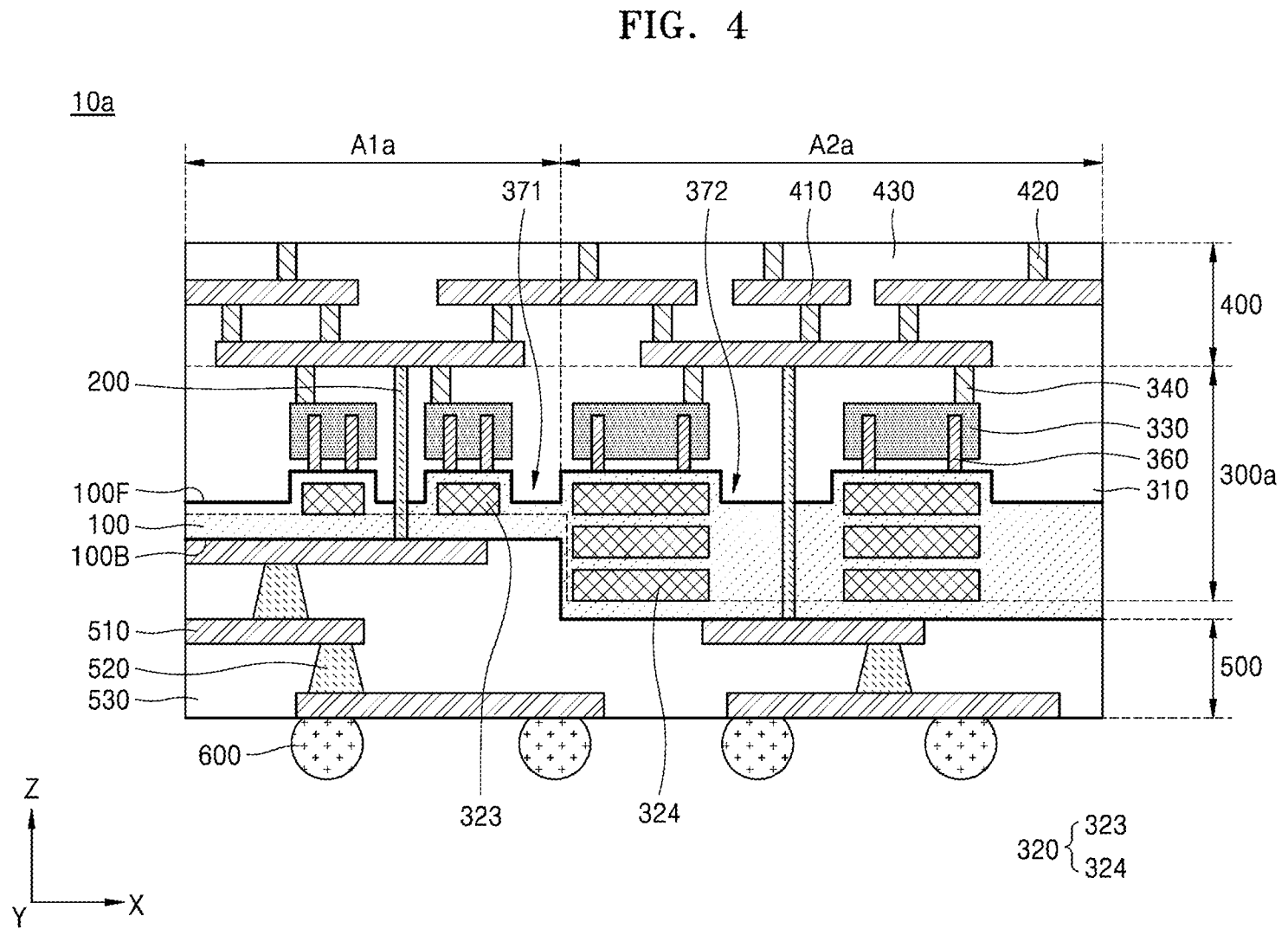

Referring to FIGS. 2 and 4, an integrated circuit semiconductor device 10a may include a substrate 100, a power via 200, a cell part 300a, a signal wiring part 400, a power transmission network part 500, and an external connection terminal 600. Hereinafter, repeated description between the integrated circuit semiconductor device 10a of FIG. 4 and the integrated circuit semiconductor device 10 described with reference to FIG. 1 will not be repeated, and differences therebetween will be mainly described. In FIG. 4, to help the understanding of the structure of the vertical transistor, the drawing is simplified.

The cell part 300a may include a horizontal transistor 323 and a vertical transistor 324. The structure of the horizontal transistor 323 may include a planar FET, a Fin FET, a GAA FET, an MBC FET, and the like. The horizontal transistor 323 may include a core transistor. The horizontal transistor 323 may be doped with a P-type dopant or an N-type dopant. Regarding the horizontal transistor 323, P-type or N-type dopants may be positioned side-by-side at the same vertical level.

The vertical transistor 324 may include a vPNP transistor. The vertical transistor 324 may be doped with a P-type dopant or an N-type dopant. The vertical transistor 324 may be alternately doped with P-type or N-type dopants vertically inside the substrate 100 the substrate. Each of the alternately doped P-type or N-type dopants may be one of an emitter, a base, and a collector. In addition, the alternately doped P-type or N-type dopant may be connected to a signal line or a power line, respectively.

A dopant thickness of the vertical transistor 324 may be greater than a dopant thickness of the horizontal transistor 323. That is, the doped region of the vertical transistor 324 may be thicker than the doped region of the horizontal transistor 323.

The substrate 100 may include a first region A1a in which the horizontal transistor 323 of the cell part 300a is located. The cell part 300a may include a first recess 371 positioned in the first region A1a of the substrate 100. The first region A1a of the substrate 100 may have a first thickness T1 from the lower surface of the first recess 371 to the second surface 100B of the substrate 100.

The substrate 100 may include a second region A2a in which the vertical transistor 324 of the cell part 300a is located. The cell part 300a may include a second recess 372 positioned in the second region A2a of the substrate 100. The second region A2a of the substrate 100 may have a second thickness T2 from the lower surface of the second recess 372 to the second surface 100B of the substrate 100.

For example, the first thickness T1 of the first region A1a including the horizontal transistor 323 may be less than the second thickness T2 of the second region A2a including the vertical transistor 324. The first thickness T1 of the first region A1a having the small dopant region may be less than the second thickness T2 of the second region A2a having the large dopant region thickness. In one embodiment, in the process of etching the second surface 100B of the substrate 100, more etching may be performed in the first region A1 than in the second region A2a and the first region A1 may have a smaller thickness of the dopant region than the second region A2a. Therefore, in relation to the substrate 100, the thickness of the first region A1a may be less than that of the second region A2a.

In some embodiments, the first thickness T1 of the first region A1a in which the horizontal transistor 323 is positioned may be about 100 nm to about 350 nm, and the second thickness T2 of the second region A2a in which the vertical transistor 324 is positioned may be greater than the first thickness T1 of the first region A1a by about 100 nm or more.

Figure 5:
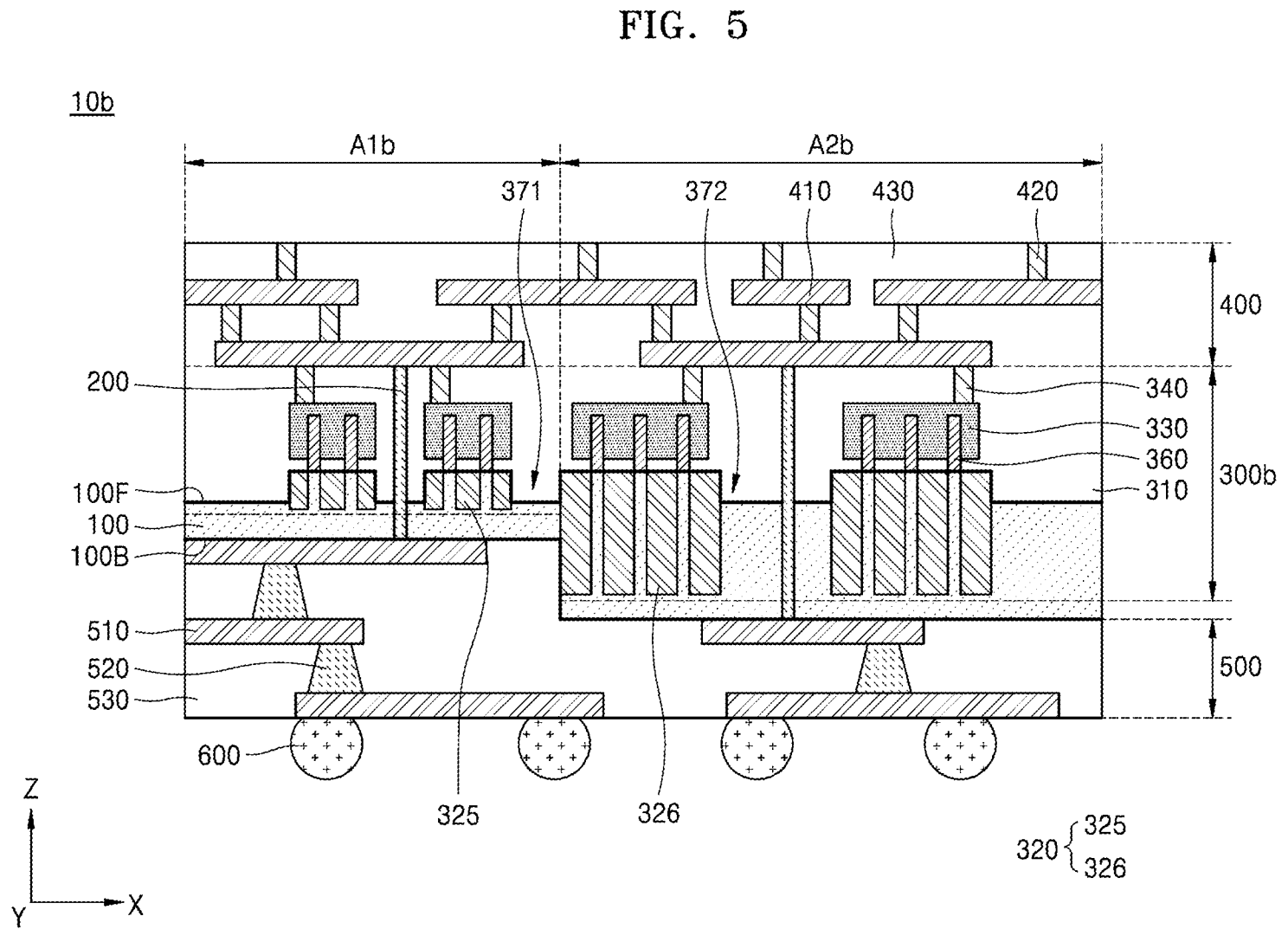

Referring to FIGS. 2 and 5, an integrated circuit semiconductor device 10b may include a substrate 100, a power via 200, a cell part 300b, a signal wiring part 400, a power transmission network part 500, and an external connection terminal 600. Hereinafter, repeated description regarding the integrated circuit semiconductor device 10b of FIG. 5 and the integrated circuit semiconductor device 10 described with reference to FIG. 1 will not be repeated, and differences therebetween will be mainly described.

The cell part 300*b* may include a plurality of memory devices 325 and 326 having different thicknesses. The memory devices 325 and 326 may include a volatile memory device, such as a dynamic RAM (DRAM) device and a static RAM (SRAM) device, and a non-volatile memory device, such as a NAND flash memory device and a flash memory device.

In some embodiments, the memory devices 325 and 326 of the cell part 300*b* may include a source region and a drain region separated from each other. The source region and the drain region may be disposed in an insulating film disposed on the first surface 100F of the substrate 100. In one embodiment, the source region and the drain region may contact the first surface 100F of the substrate 100. For example, the source region and the drain region may contact the active fin 360. In some embodiments a source region and a drain region may be disposed on ends of the active fin 360. The source region and drain region may include a semiconductor material and/or a dopant element (e.g., a B, P or As element).

In some embodiments, the cell part 300*b* may include a first memory device 325 and a second memory device 326. The thickness of the second memory device 326 may be greater than the thickness of the first memory device 325 of the cell part 300*b*. The substrate 100 may include a first region A1*b* in which the first memory device 325 is positioned and a second region A2*b* in which the second memory device 326 is positioned. The cell part 300*b* may include a first recess 371 positioned in the first region A1*b* and a second recess 372 positioned in the second region A2*b*. A length from the lower surface of the first recess 371 of the cell part 300*b* to the second surface 100*b* of the substrate 100 may be the first thickness T1. A length from the lower surface of the second recess 372 of the cell part 300*b* to the second surface 100B of the substrate 100 may be the second thickness T2. The second thickness T2 of the second region A2*b* may be greater than the first thickness T1 of the first region A1*b*.

In some embodiments, the first thickness T1 of the first region A1*b* in which the first memory device 325 is located may be about 100 nm to about 350 nm, and the second thickness T2 of the second region A2*b* in which the second memory device 326 is located may be greater than the first thickness T1 of the first region A1*b* by about 100 nm or more.

Figure 6:
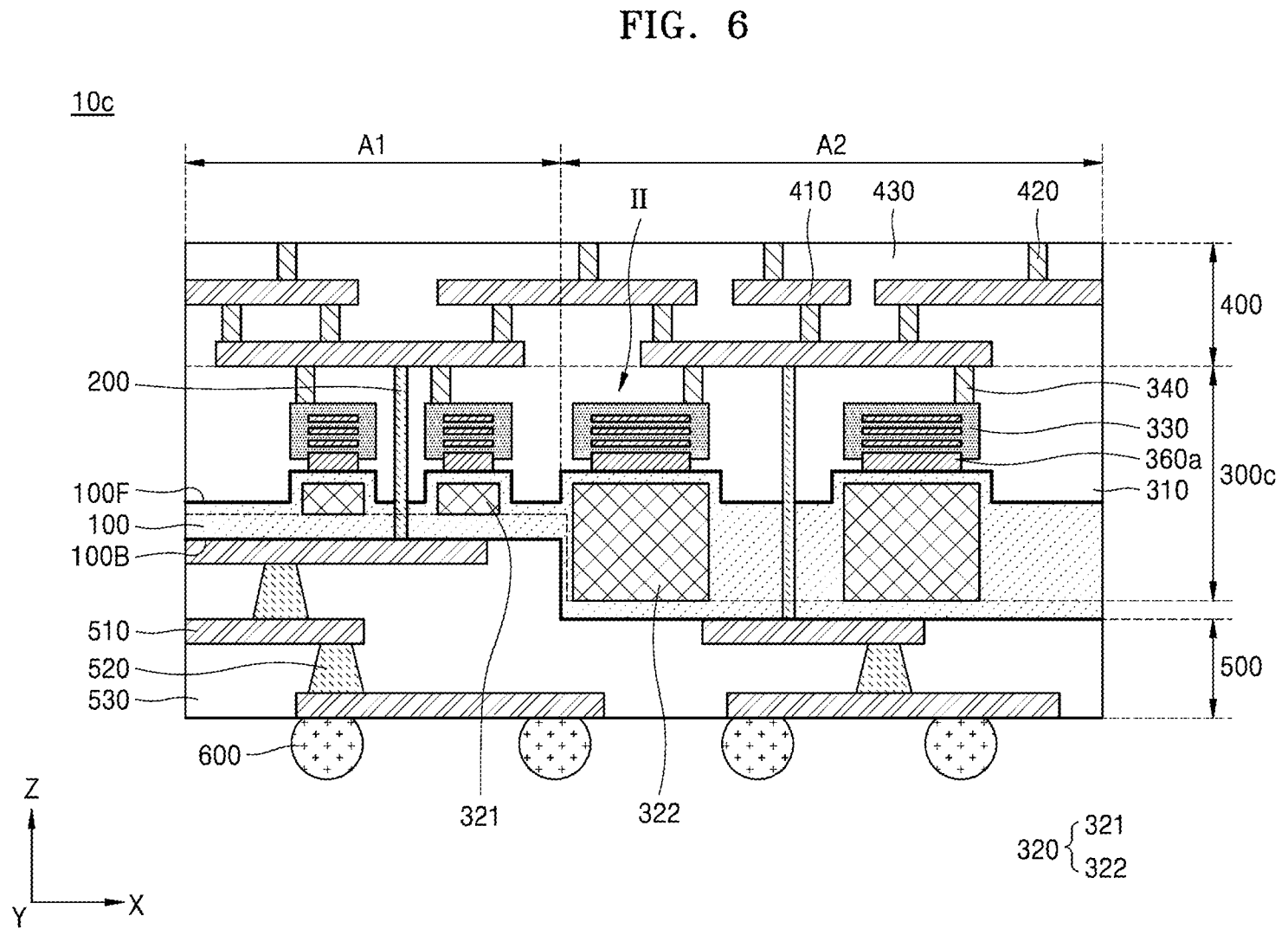

Referring to FIGS. 2 and 6, an integrated circuit semiconductor device 10*c* the integrated circuit semiconductor device 10 may include a substrate 100, a power via 200, a cell part 300*c*, a signal wiring part 400, a power transmission network part 500, and an external connection terminal 600. Hereinafter, repeated description regarding the integrated circuit semiconductor device 10*c* of FIG. 6 and the integrated circuit semiconductor device 10 described with reference to FIG. 1 will be not be repeated, and differences therebetween will be mainly described.

The cell part 300*c* may include a local interconnect 330, a cell via 340, and a nanosheet 360*a*. The cell via 340 may connect the local interconnect 330 to the upper multilayer wiring layer 410 of the signal wiring part 400. The nanosheet 360*a* may connect the local interconnect 330 to individual elements 320. The local interconnect 330 may transmit signals and power to the individual elements 320 of the cell part 300*c*. The nanosheet 360*a* may be formed to protrude above the individual elements 320. The nanosheet 360*a* may be formed of a plurality of layers. As an, in FIG. 6, the nanosheet 360*a* is shown as four layers, but embodiments are not limited thereto and the nanosheet 360*a* may have three or more layers. The local interconnect 330 may surround some of upper layers of an upper portion of a portion of the plurality of layers of the nanosheet 360*a*. The local interconnect 330 may completely surround the rest of the plurality of layers of the nanosheet 360*a*. For example, all four sides of the rest of the plurality of layers of the nanosheet 360*a* may be in contact with the local interconnect 330. A contact surface between the local interconnect 330 and the nanosheet 360*a* may be increased to facilitate signal and power transmission.

Figure 7:
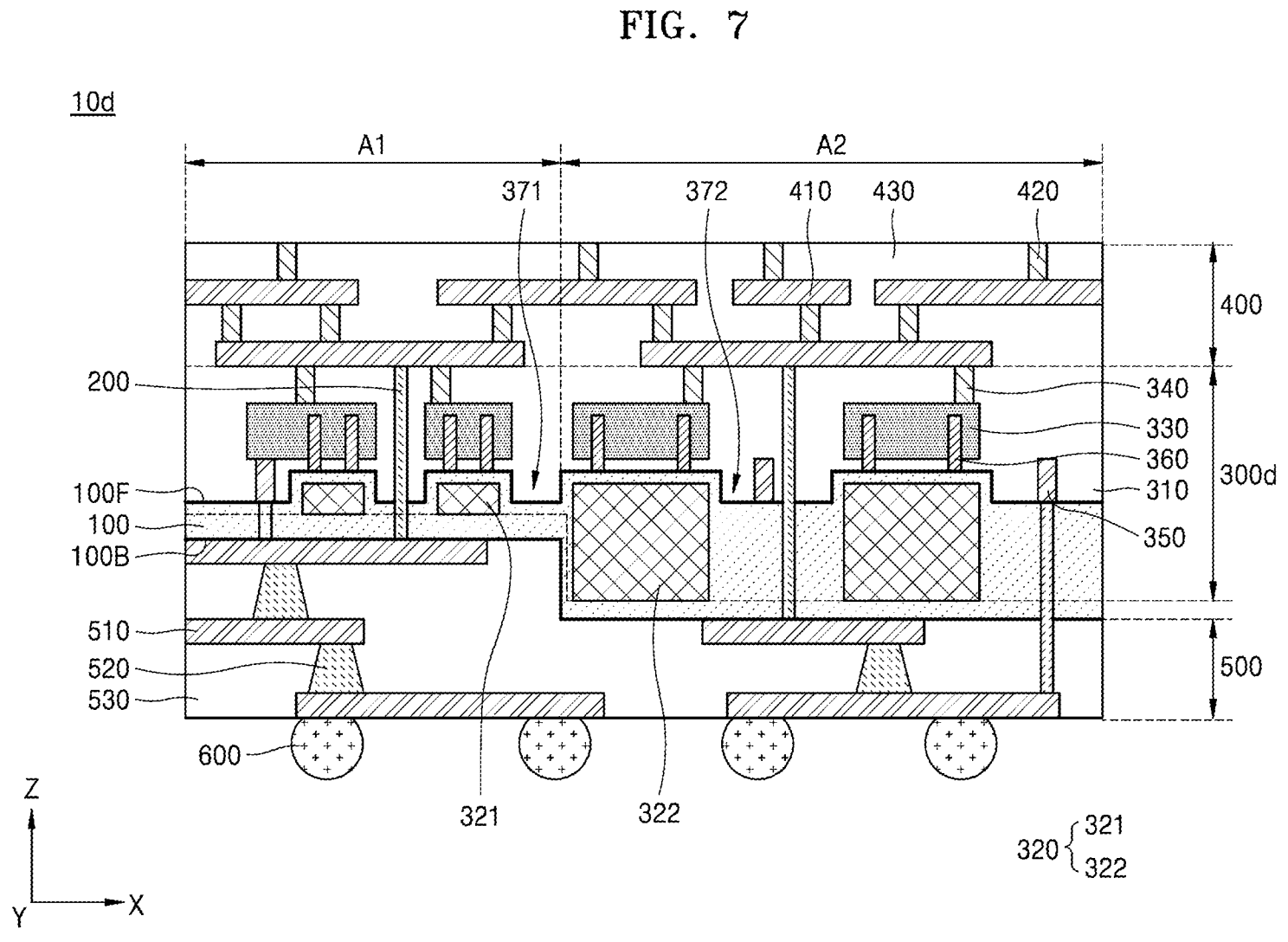

Referring to FIGS. 2 and 7, an integrated circuit semiconductor device 10*d* may include a substrate 100, a power via 200, a cell part 300*d*, a signal wiring part 400, a power transmission network part 500, and an external connection terminal 600. Hereinafter, repeated description regarding the integrated circuit semiconductor device 10*d* of FIG. 7 and the integrated circuit semiconductor device 10 described with reference to FIG. 1 will not be repeated, and differences therebetween will be mainly described.

The cell part 300*d* may include an insulating layer 310, a plurality of individual elements 320, a cell via 340, a local interconnect 330, and a recess. The cell part 300*d* may further include a buried conductive line 350 or a protruding conductive line.

The buried conductive line 350 may be buried by the insulating layer 310. The buried conductive line 350 may be made of a conductive material. In some embodiments, the buried conductive line 350 may be made of a metal doped with impurities, such as silicon, tungsten, or ruthenium. The buried conductive line 350 may include any one of a power line and a signal line. In some embodiments, the insulating layer 310 may be a silicon oxide layer.

The local interconnect 330 may include a local interconnect connected to the buried conductive line 350 and a local interconnect not connected to the buried conductive line. The local interconnect connected to the buried conductive line 350 may be a power or ground wiring. The local interconnect not connected to the buried conductive line 350 and the local interconnect connected to the buried conductive line 350 may be a signal local interconnect. The local interconnect 330 may be insulated by the insulating layer 310. In some embodiments, the insulating layer 310 may be a silicon oxide layer.

In some embodiments, the cell part 300*d* may include a source line, a drain line, and a middle of line (MOL), which are non-buried conductive lines. The power via 200 may be connected to the buried conductive line 350 or the protruding conductive line of the cell part 300*d*. The power via 200 may transmit power to the individual elements 320 through the buried conductive line 350 or the protruding conductive line. The power via 200 connected to the buried conductive line 350 or the protruding conductive line may have a lower aspect ratio than that described previously, thereby making it easier to process.

Figure 8:
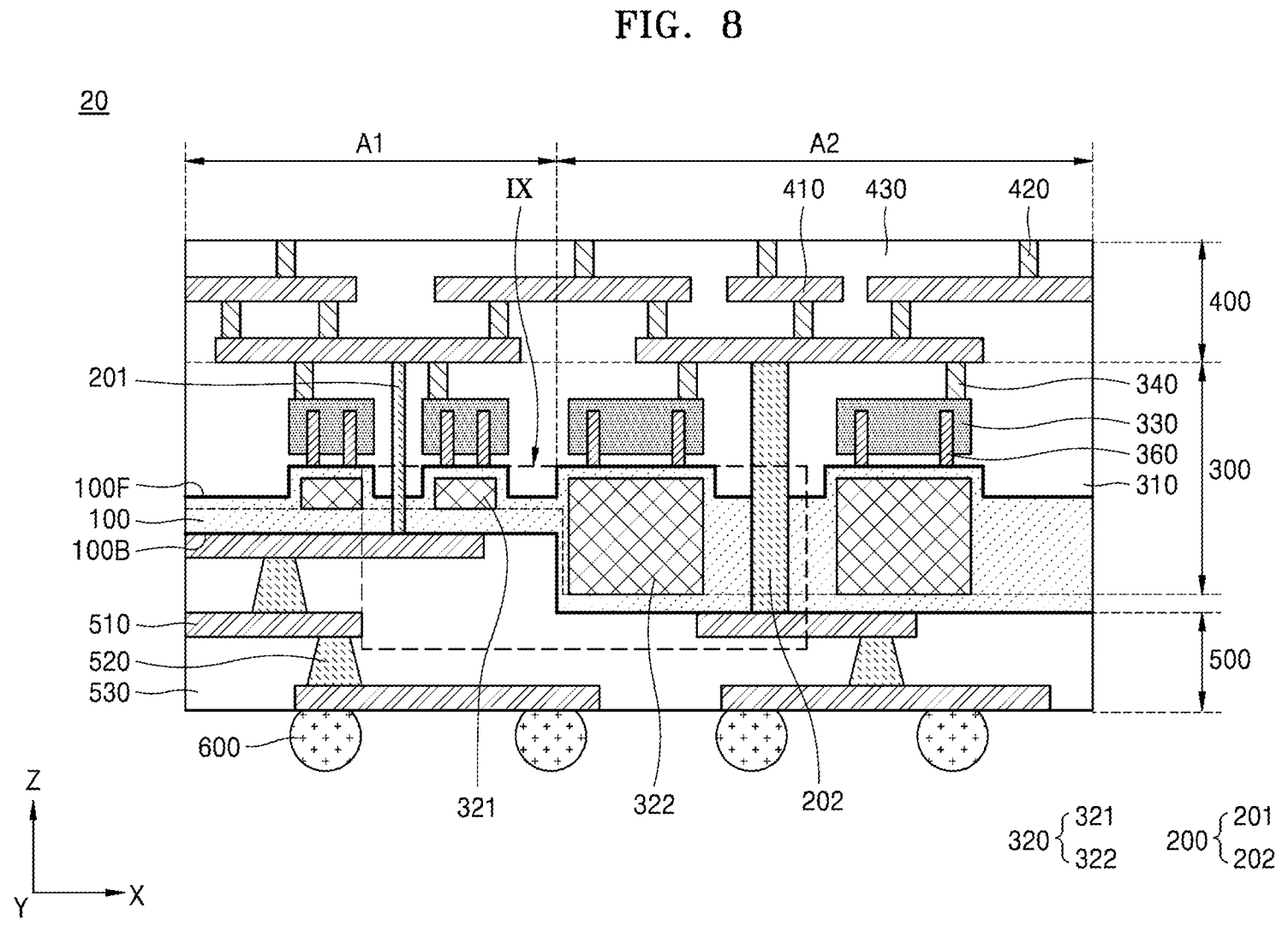

FIG. 8 is a cross-sectional view illustrating an integrated circuit semiconductor device according to embodiments of the inventive concept. FIG. 9 is an enlarged cross-sectional view of the region indicated by "IX" of FIG. 8.

Referring to FIGS. 8 and 9, an integrated circuit semiconductor device 20 may include a substrate 100, a plurality of power vias 200, a cell part 300, a signal wiring part 400, a power transmission network part 500, and an external connection terminal 600. Repeated description regarding the integrated circuit semiconductor device 20 of FIG. 8 and the integrated circuit semiconductor device 10 as described with reference to FIG. 1 will not be repeated, and differences therebetween will be mainly described.

The plurality of power vias 200 of the integrated circuit semiconductor device may have different horizontal widths. In some embodiments, the plurality of power vias 200 may include a first power via 201 having a first width W1 and a second power via 202 having a second width W2. The first width W1 of the first power via 201 may be different from the second width W2 of the second power via 202. In some implementations, the first width W1 of the first power via 201 may be less than the second width W2 of the second power via 202.

In some embodiments, the cell part 300 may include a first individual element 321 and a second individual element 322. The thickness of the second individual element 322 may be greater than the thickness of the first individual element 321. For example, the dopant depth of the second individual element 322 may be greater than the dopant depth of the first individual element 321.

In some embodiments, the substrate 100 may include a first region A1 in which the first individual element 321 of the cell part 300 is located. The substrate 100 may include a second region A2 in which the second individual element 322 of the cell part 300 is located. The first power via 201 may pass through the first region A1, and the second power via 202 may pass through the second region A2. In some embodiments, the first power via 201 may pass through a substrate adjacent to the first individual element 321, and the second power via 202 having a width greater than that of the first power via 201 may pass through the second region A2, which is thicker than the first region A1.

Referring to some embodiments as illustrated in FIG. 9, the first width W1 of the first power via 201 passing through the first region A1 may be about 50 nm to about 100 nm, and the second width W2 of the second power via 202 passing through the second region A2 may be about 200 nm to about 700 nm.

The second individual element 322, having a thickness greater than that of the first individual element 321, may have a pitch and margin greater than that of the first individual element 321. Accordingly, the width of the second power via 202 passing through the second region A2 including the second individual element 322 may be increased. A via with an increased width may have a lower aspect ratio, which may facilitate the manufacturing process.

The substrate 100 of the integrated circuit semiconductor device 20 may include regions A1 and A2 having different thicknesses. The cell part 300 may include a first recess 371 positioned in the first region A1 of the substrate 100. A length from the lower surface of the first recess 371 positioned in the first region A1 of the substrate 100 to the second surface 100B of the substrate 100 may be the first thickness T1. The cell part 300 may include a first recess 372 positioned in the second region A2 of the substrate 100. A length from the lower surface of the second recess 372 positioned in the second region A2 of the substrate 100 to the second surface 100B of the substrate 100 may be the second thickness T2. The first thickness T1 of the first region A1 may be greater than the second thickness T2 of the second region A2.

In some embodiments, the first thickness T1 of the first region A1 of the substrate 100 may be about 100 nm to about 350 nm. The first thickness T1 of the first region A1 may be equal to or greater than the thickness of the first individual element 321. The second thickness T2 of the second region A2 of the substrate 100 may be greater than the first thickness T1 of the first region A1 by about 100 nm or more. The second thickness T2 of the second region A2 may be equal to or greater than the thickness of the second individual element 322.

In regions where the thickness of individual elements is small, the thickness of the substrate is small, such that the aspect ratio of the vias may be lowered. In a region with a large individual element thickness, the width of the power via may be large, such that the aspect ratio of the via may be lowered. When the aspect ratio of the via is lowered, the difficulty of the process of making the via may be reduced, thereby facilitating the process of forming the via.

Figure 10:
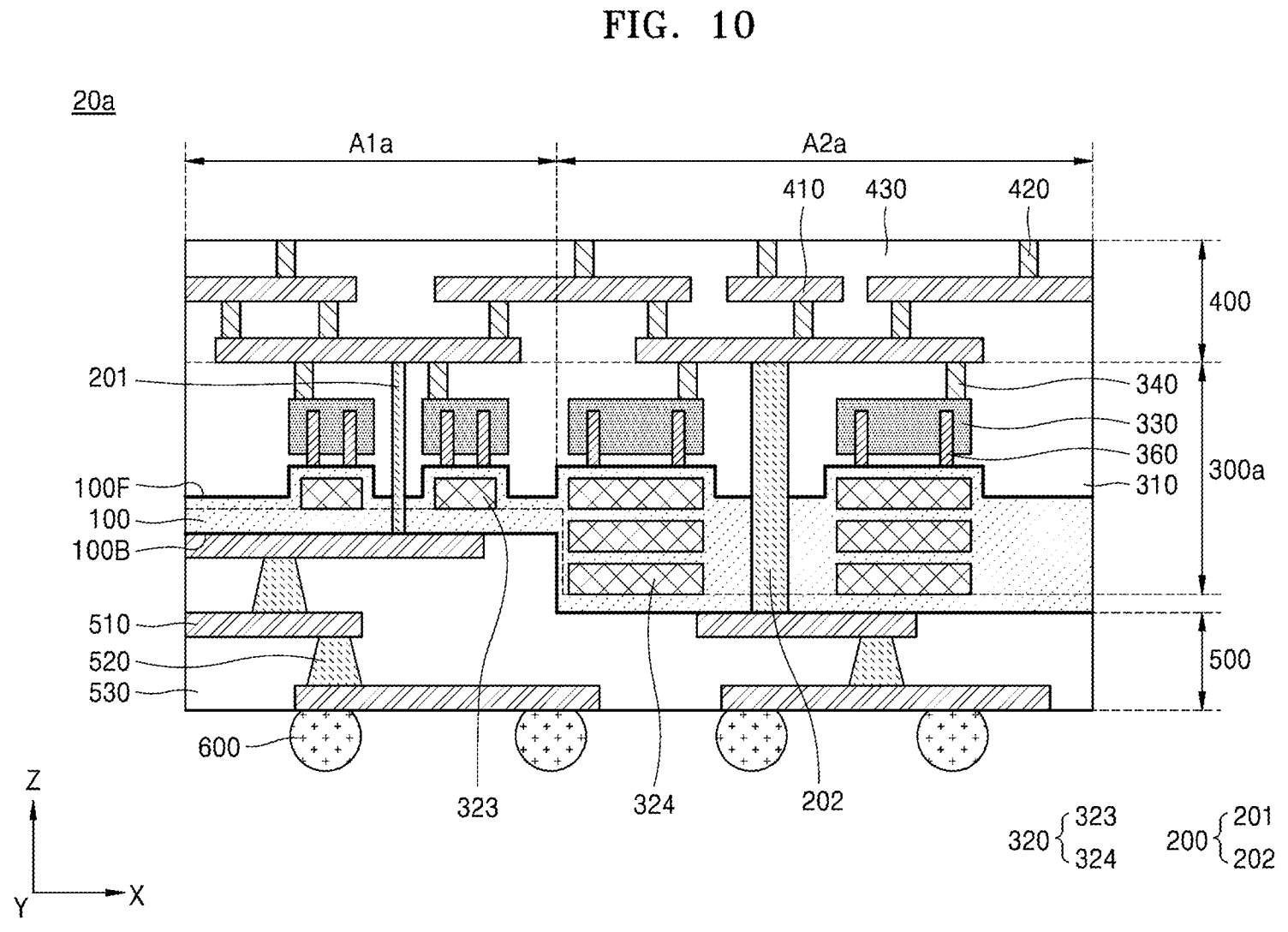
Figure 11:
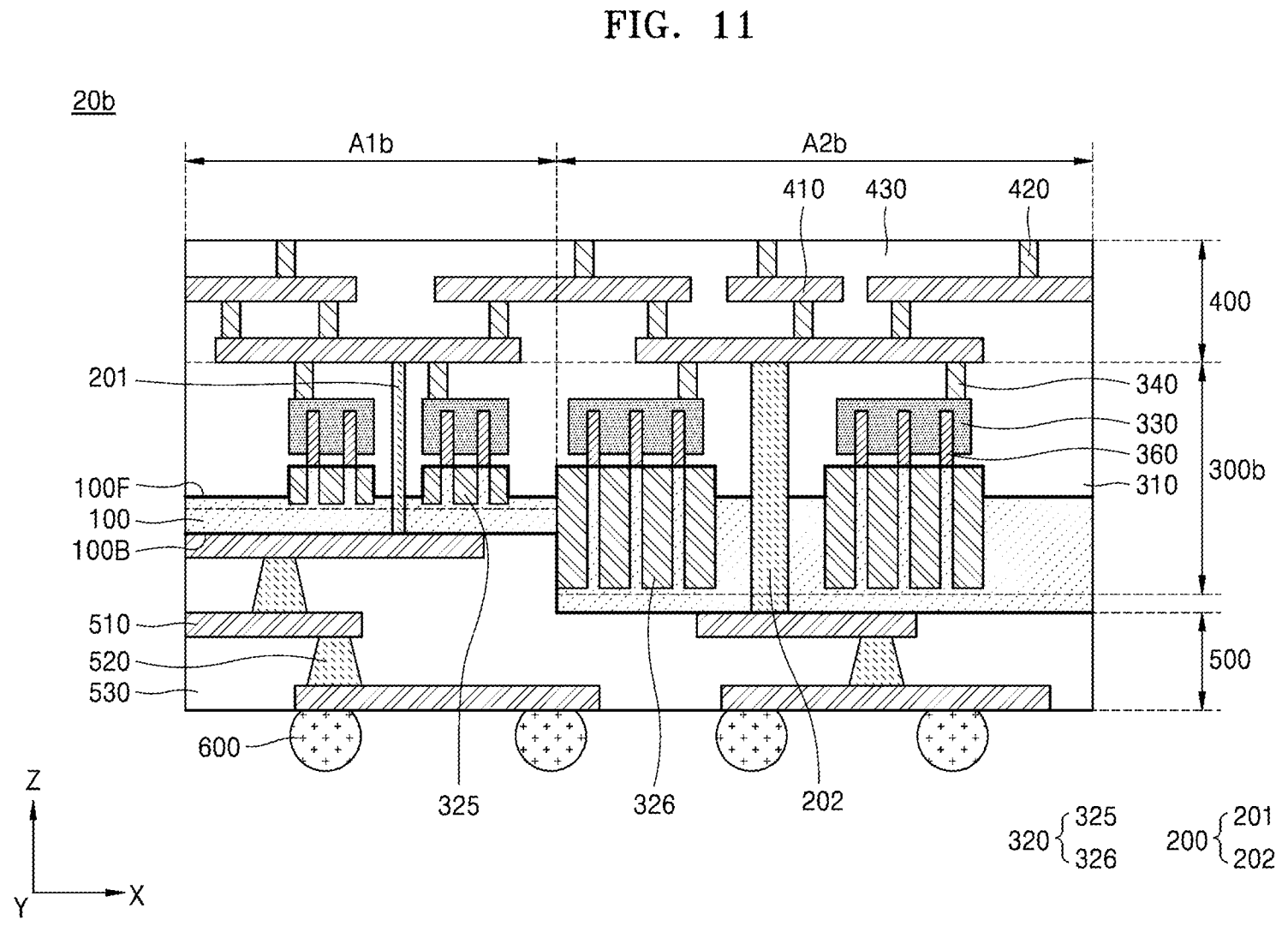
Figure 12:
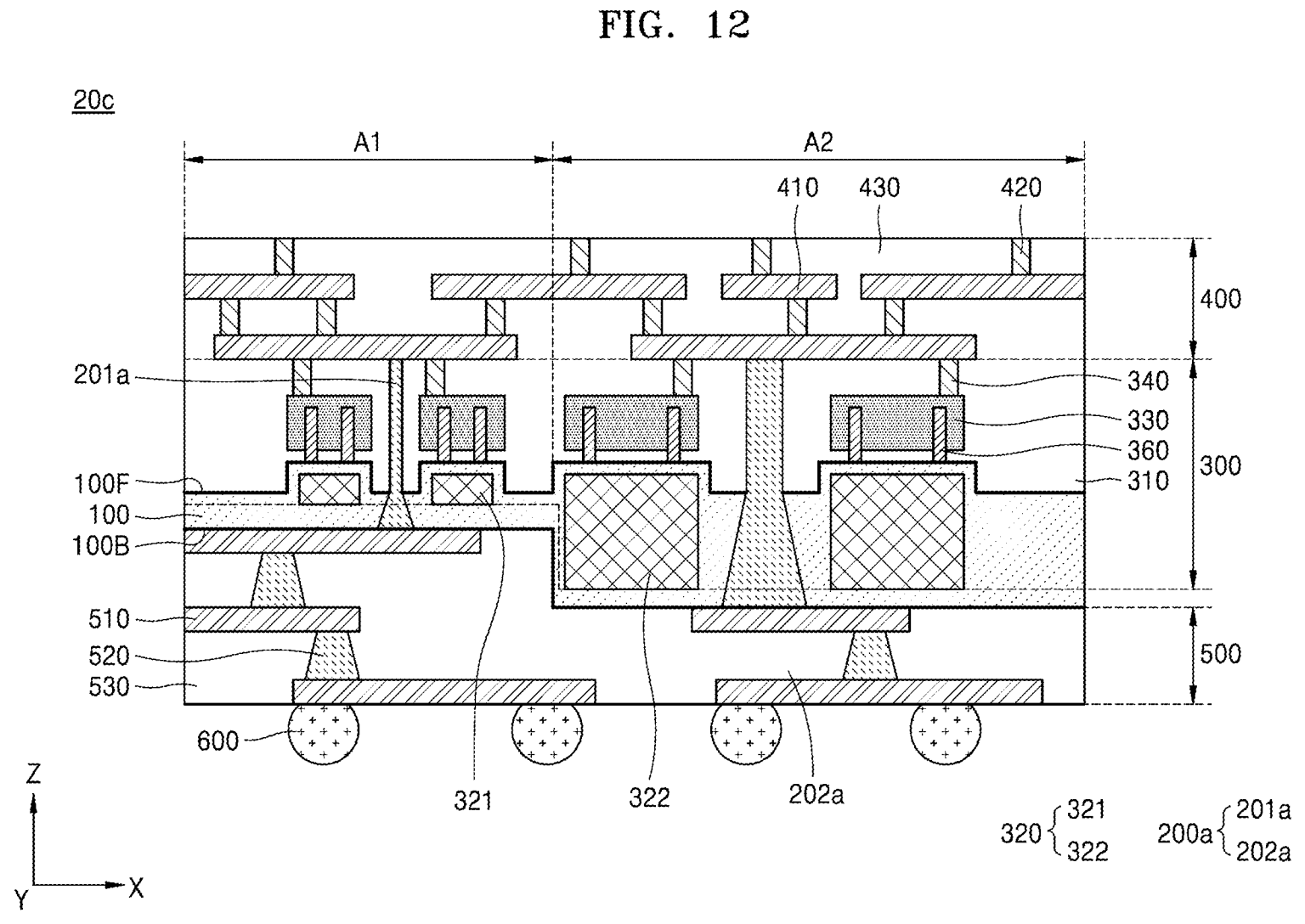

FIGS. 10 to 12 are cross-sectional views illustrating integrated circuit semiconductor devices according to embodiments.

Referring to FIGS. 9 and 10, an integrated circuit semiconductor device 20a may include a substrate 100, a power via 200, a cell part 300a, a signal wiring part 400, a power transmission network part 500, and an external connection terminal 600. Hereinafter, repeated description regarding the integrated circuit semiconductor device 20a of FIG. 10 and the integrated circuit semiconductor device 10a described with reference to FIG. 4 will not be repeated, and differences therebetween will be mainly described.

The cell part 300a may include a horizontal transistor 323 and a vertical transistor 324. A dopant depth of the horizontal transistor 323 may be less than a dopant depth of the vertical transistor 324. The vertical transistor 324 may include a vPNP transistor. In the vertical transistor 324, P-type or N-type dopants may be alternately stacked inside the substrate. In relation to the horizontal transistor 323, P-type or N-type dopants may be positioned side-by-side at the same vertical level.

The substrate 100 may include a first region A1a in which the horizontal transistor 323 of the cell part 300a is located. The substrate 100 may include a second region A2a in which the vertical transistor 324 of the cell part 300a is located.

In some embodiments, the plurality of power vias may include a first power via 201 having a first width and a second power via 202 having a second width. The first width W1 of the first power via 201 may be greater than the second width W2 of the second power via 202. The first power via 201 may pass through the first region A1a in which the horizontal transistor 323 is located. The second power via 202 may pass through the second region A2a in which the vertical transistor 324 is located.

In some embodiments, the first width W1 of the first power via 201 may be from about 50 nm to about 100 nm, and the second width W2 of the second power via 202 may be from about 200 nm to about 700 nm.

Referring to FIGS. 9 and 11, an integrated circuit semiconductor device 20b may include a substrate 100, a power via 200, a cell part 300b, a signal wiring part 400, a power transmission network part 500, and an external connection terminal 600. Hereinafter, repeated description regarding the integrated circuit semiconductor device 20b of FIG. 11 and the integrated circuit semiconductor device 10b described with reference to FIG. 5 will not be repeated, and differences therebetween will be mainly described.

The cell part 300b may include a plurality of memory devices 325 and 326 having different thicknesses. The memory devices 325 and 326 may include a volatile memory device, such as a DRAM device and an SRAM device, and a non-volatile memory device, such as a NAND flash memory device and a flash memory device.

In some embodiments, the cell part 300b may include a first memory device 325 and a second memory device 326.

The thickness of the second memory device 326 may be greater than the thickness of the first memory device 325 of the cell part 300b. The substrate 100 may include a first region A1b in which the first memory device 325 is positioned and a second region A2b in which the second memory device 326 is positioned.

In some embodiments, the plurality of power vias may include a first power via 201 having a first width and a second power via 202 having a second width. The first width W1 of the first power via 201 may be greater than the second width W2 of the second power via 202. The first power via 201 may pass through the first region A1b in which the first memory device 325 is located. The second power via 202 may pass through the second region A2b in which the second memory device 326 is located.

In some embodiments, the first width W1 of the first power via 201 may be from about 50 nm to about 100 nm, and the second width W2 of the second power via 202 may be from about 200 nm to about 700 nm.

Referring to FIGS. 9 and 12, an integrated circuit semiconductor device 20c may include a substrate 100, a power via 200a, a cell part 300, a signal wiring part 400, a power transmission network part 500, and an external connection terminal 600. Hereinafter, repeated description regarding the integrated circuit semiconductor device 20c of FIG. 12 and the integrated circuit semiconductor device 20 described with reference to FIG. 8 will not be repeated, and differences therebetween will be mainly described.

In some embodiments, the horizontal width of the first power via 201a may gradually decrease toward the first surface 100F of the substrate 100. That is, the first power via 201a may have a tapered shape in which a horizontal width thereof narrows toward the first surface 100F of the substrate 100. The horizontal width of the second power via 202a may gradually decrease toward the first surface 100F of the substrate 100. For example, the first power via 202a may have a tapered shape in which a horizontal width thereof narrows toward the first surface 100F of the substrate 100.

Each power via of the power via 200a may be adjacent to the first surface 100F of the substrate 100. Accordingly, when the horizontal width of each power via of the power via 200a narrows, the aspect ratio of the power via is lowered, such that the process of forming a power via may be facilitated. In addition, the reliability of power transmission may be improved by increasing the horizontal width of the power via.

FIGS. 13A to 13L are cross-sectional views illustrating a method of manufacturing an integrated circuit semiconductor device, according to an embodiment of a process sequence.

Figure 13A:
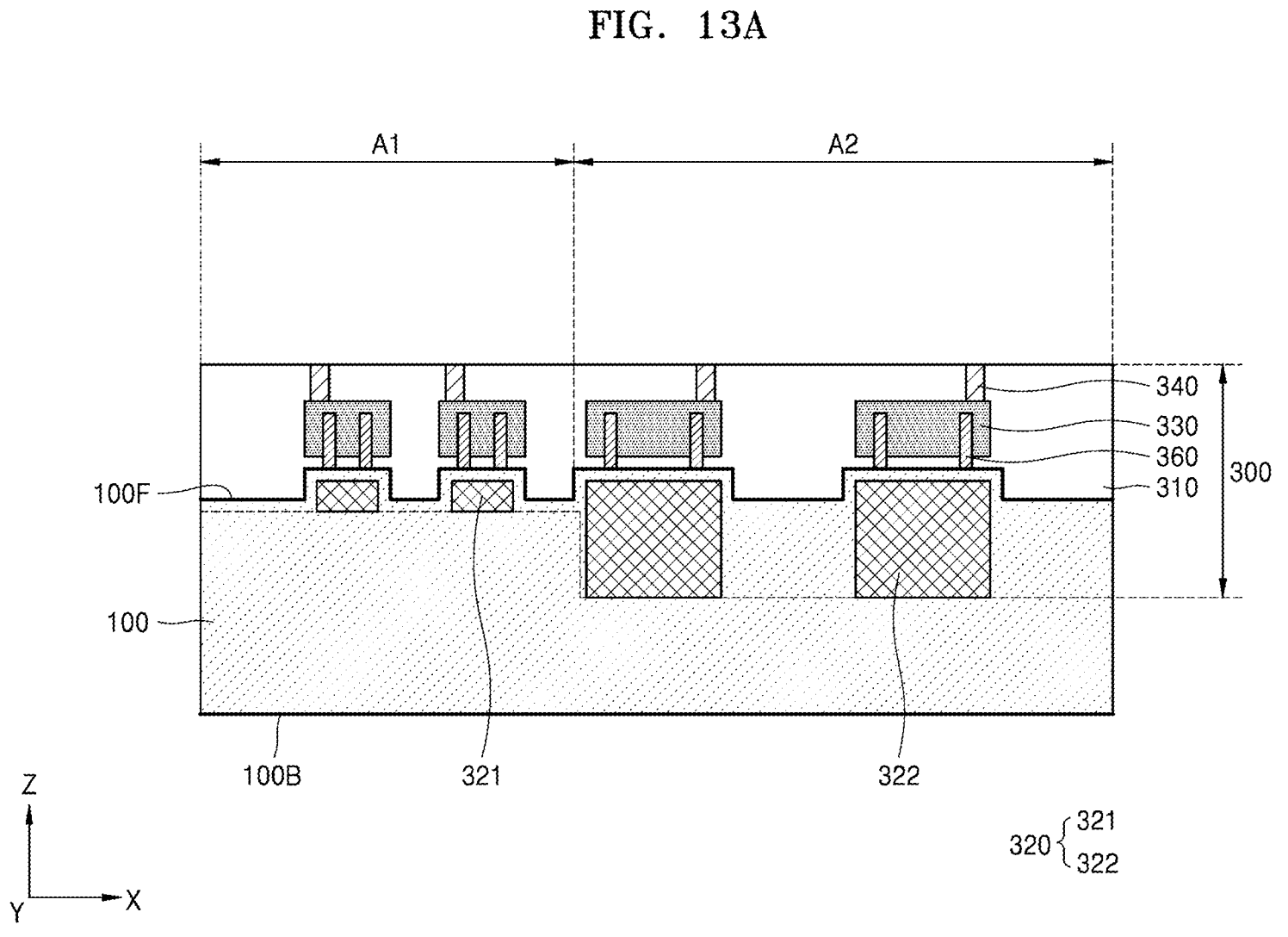

FIG. 13A is an operation of forming the cell part 300 on the first surface 100F of the substrate 100. The operation of forming the cell part 300 may include an FEOL process operation and an MOL process operation. In some embodiments, the FEOL process operation may include an isolation operation, an N-type well or a P-type well formation operation, a gate oxidation operation, a source region and drain region formation operation, and an insulating layer 310 formation operation. The substrate 100 may include a first region A1, which is a region in which the first individual element 321 is formed, and a second region A2, which is a region in which a second individual element 322 having a thickness greater than that of the first individual element 321 is formed.

Figure 13B:
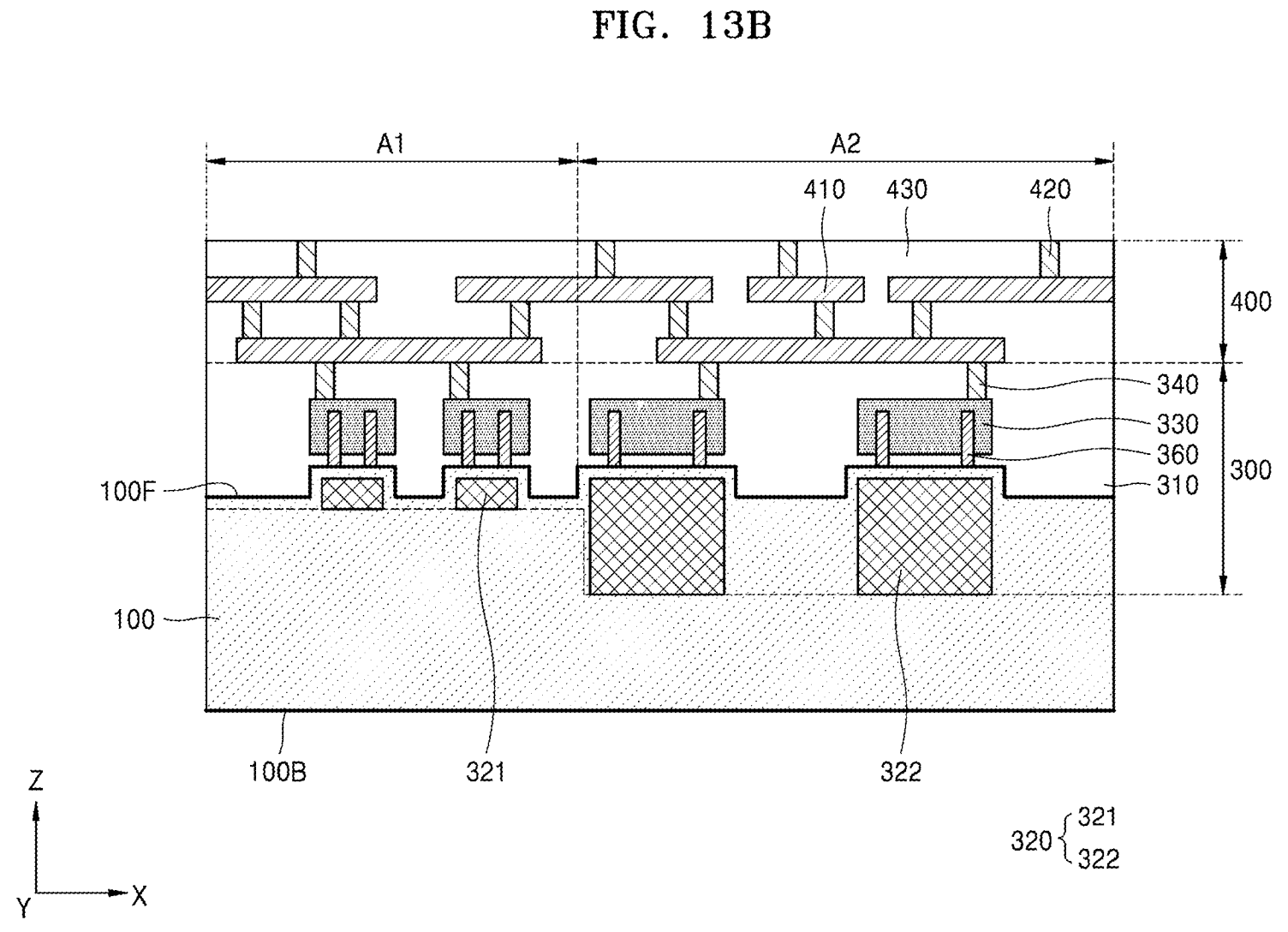

FIG. 13B illustrates an operation of forming the signal wiring part 400 on the upper part of the cell part 300. The operation of forming the signal wiring part 400 may include a BEOL process operation. In some embodiments, the BEOL process operation may include a contact formation operation, a wiring pattern formation operation, an insulating layer formation operation, a via hole formation operation, a via plug formation operation, and a passivation formation operation.

Figure 13C:
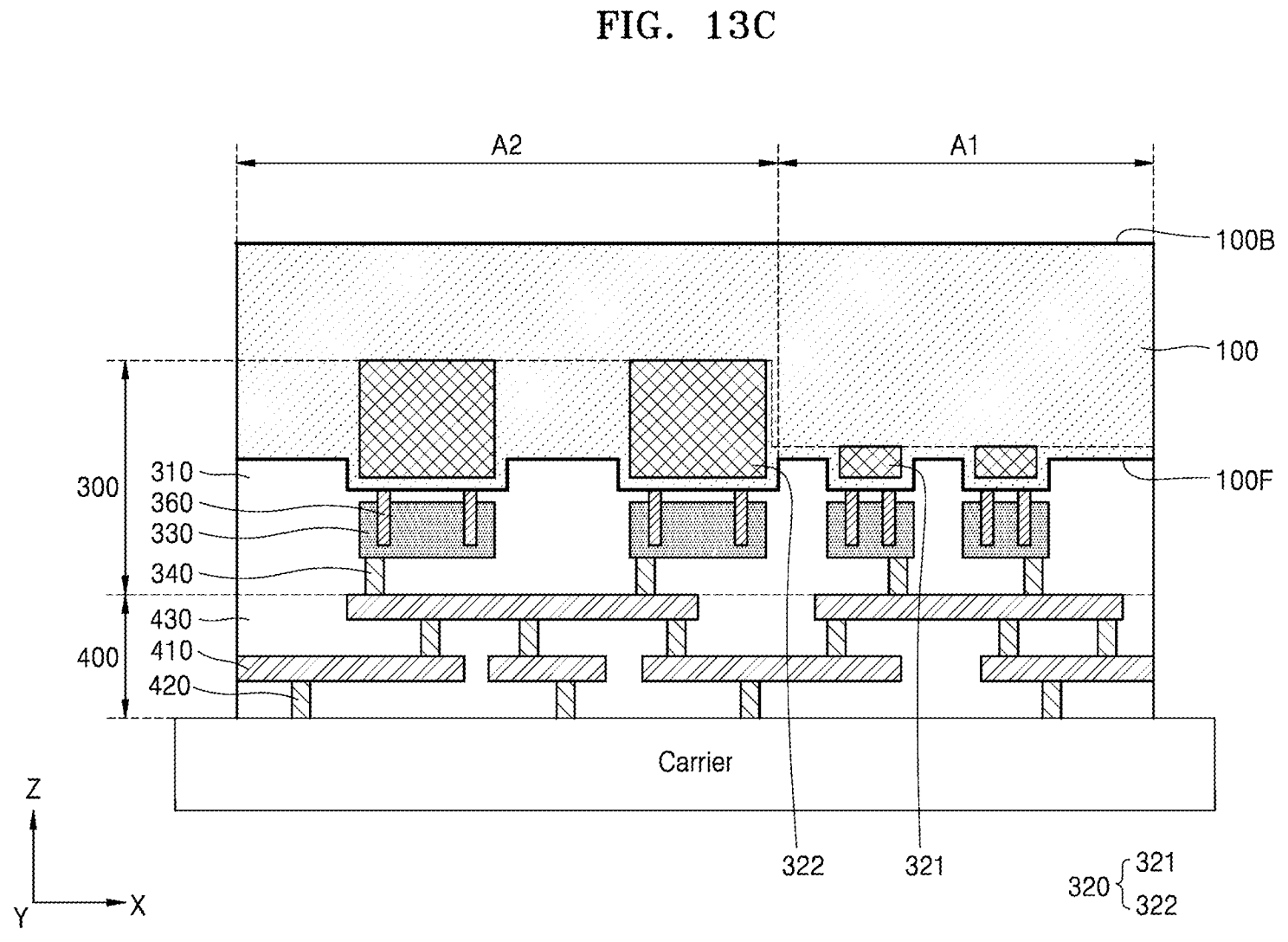
Figure 13D:
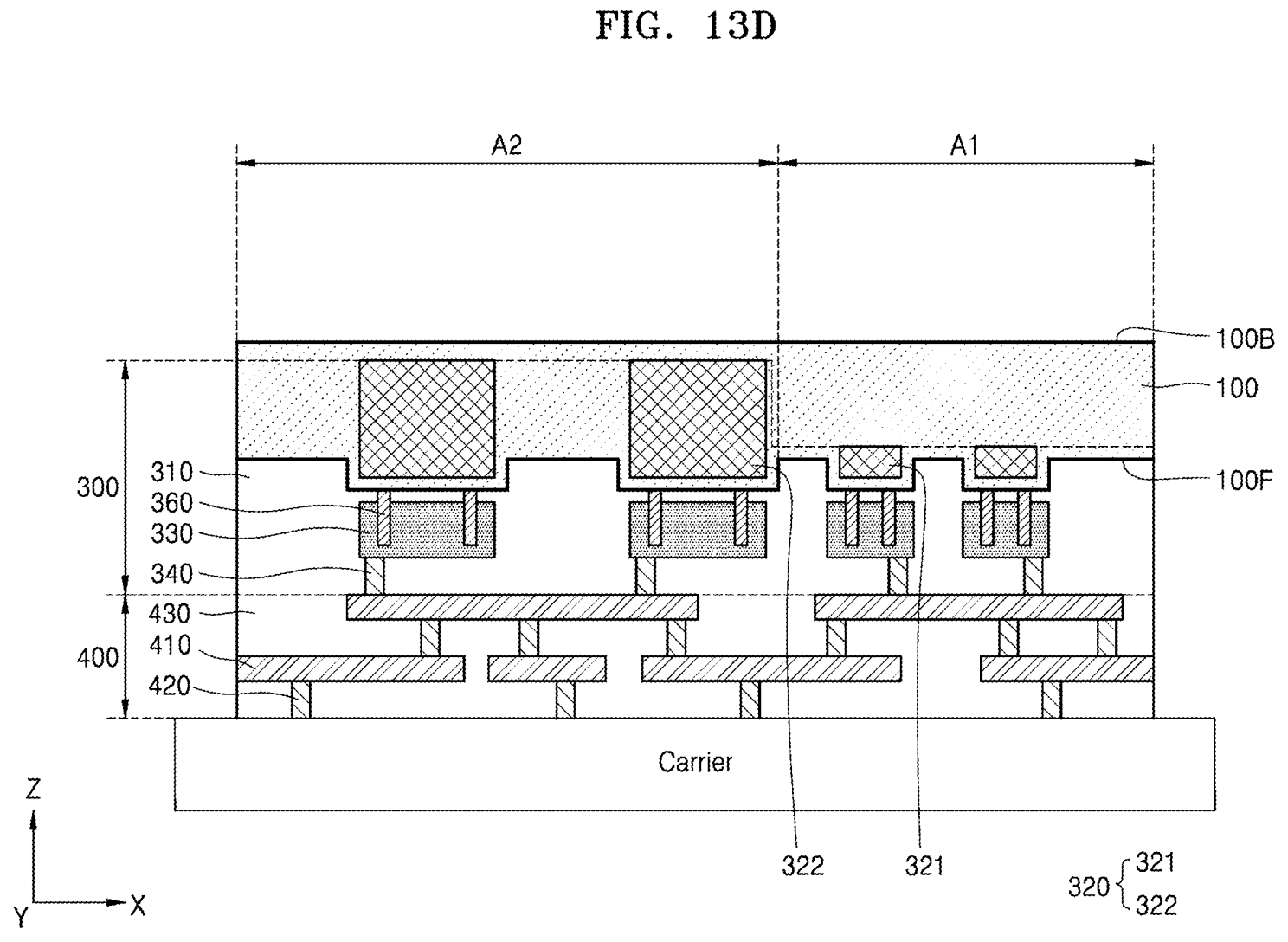

FIG. 13C illustrates an operation of attaching the signal wiring part 400 to the upper portion of a carrier, and FIG. 13D is an operation of uniformly grinding the second surface 100B of the substrate 100. The carrier attachment operation may include a pretreatment operation before polishing the substrate 100. A method of polishing the second surface 100B of the substrate 100 may include a chemical mechanical polishing (CMP) method. Grounding of the substrate through a CiVIP method may allow the substrate 100 to have a constant thickness in both regions A1 and A2. After the CMP process, the thickness of the substrate may be equal to or greater than the thickness of the second individual element 322.

Figure 13E:
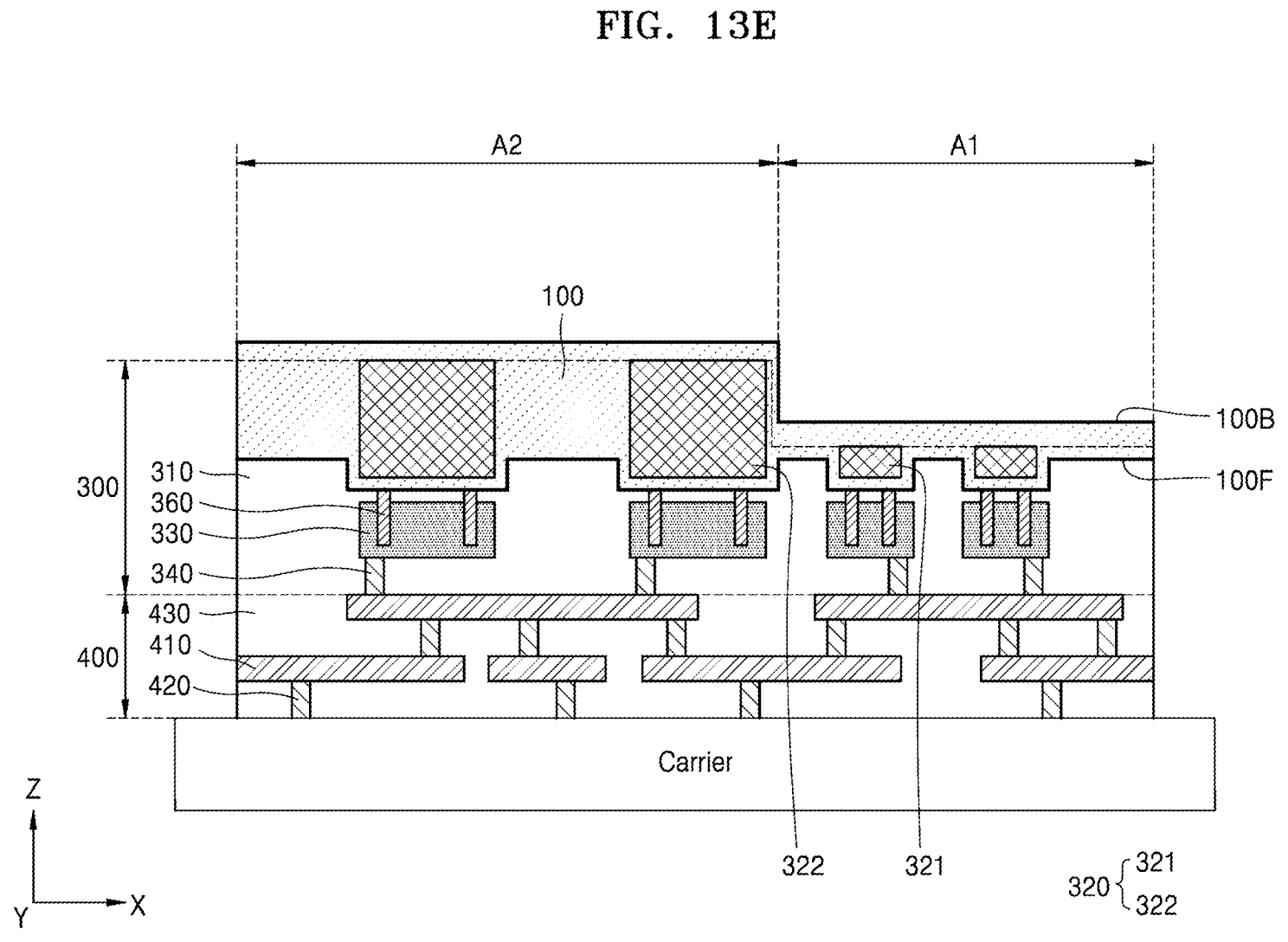

FIG. 13E illustrates an operation of additionally performing an etching process on the substrate 100 for each region of an individual element. The process of additionally etching only a certain region of the substrate 100 may include a patterning process. The patterning process may include a photolithography application process and an exposure process. The thickness of the substrate 100 in the region where the additional etching process has been performed may be the same as or greater than the thickness of the individual element positioned in the region. In some embodiments, the length from the recess of the cell part of the region in which the additional etching process has been performed to the second surface of the substrate may be 100 nm to 350 nm.

Figure 13F:
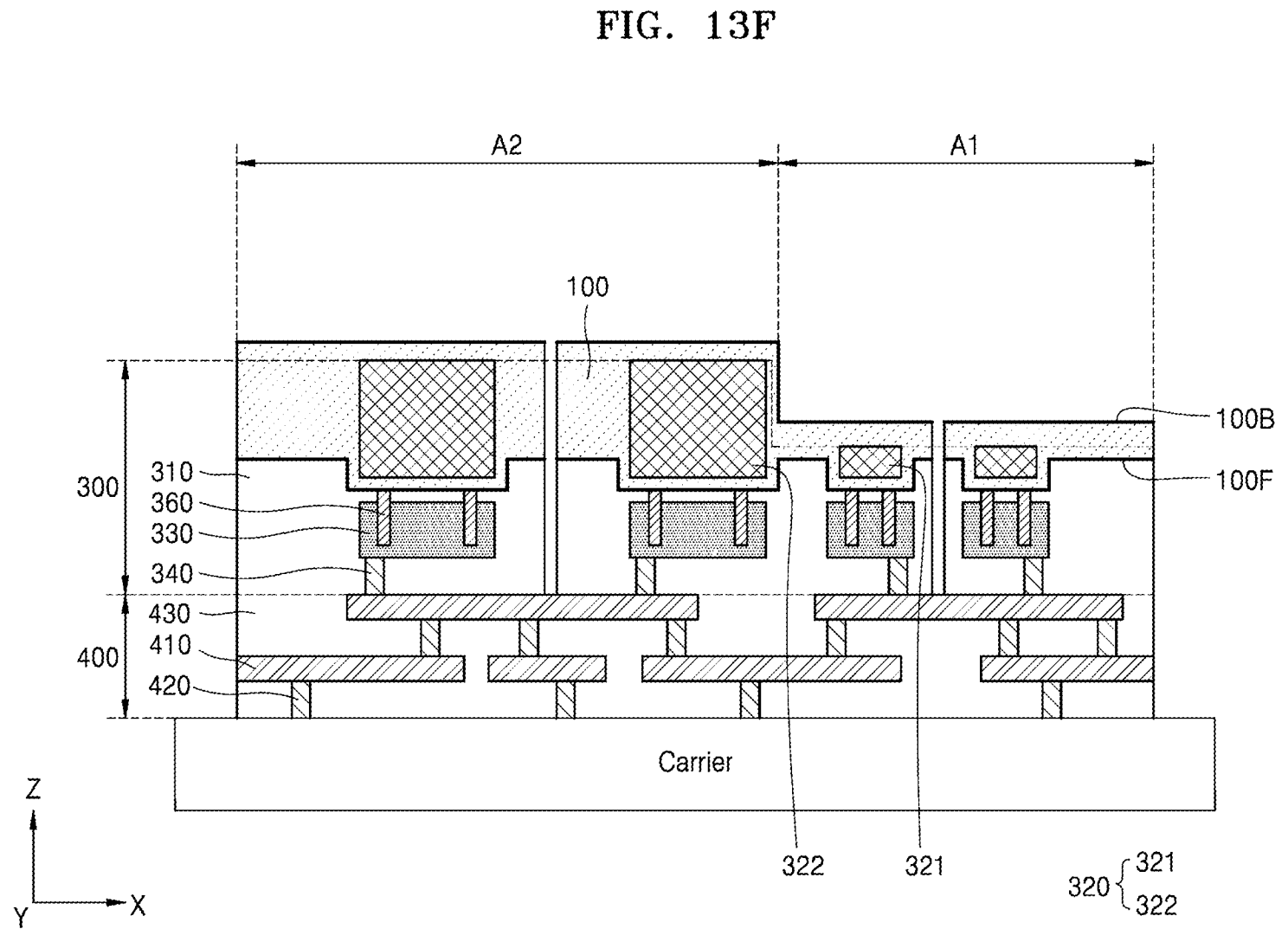
Figure 13G:
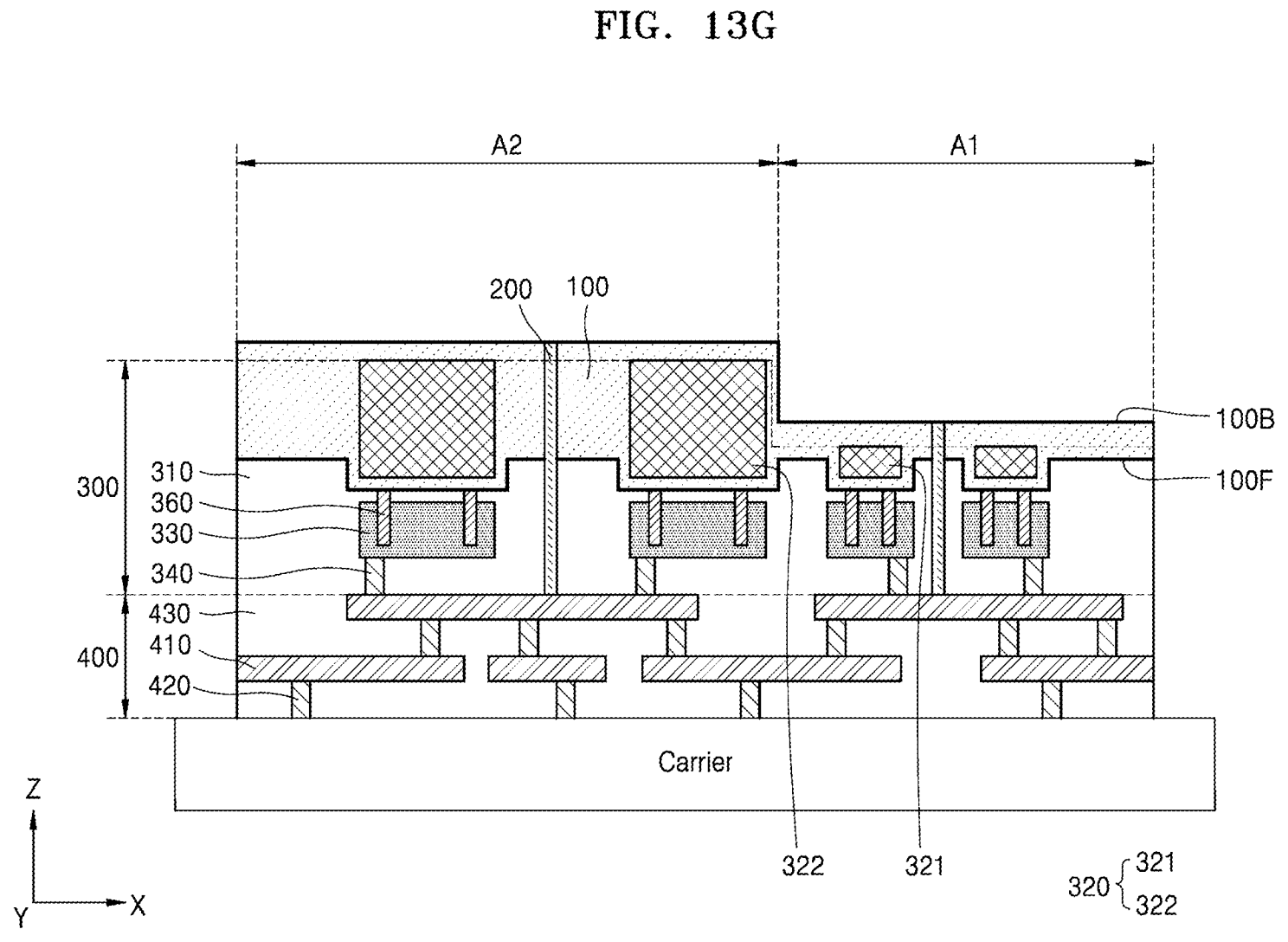

FIGS. 13F and 13G show the power via 200 formation operation. In the power via 200 formation operation, a mask pattern may be made on the second surface 100B of the substrate 100, and the substrate 100 and the insulating layer 310 may be etched using the mask pattern as an etching mask to form a through hole. The through hole may pass through the substrate 100 and the insulating layer 310, and a wiring layer adjacent to the insulating layer 310 among the upper multilayer wiring layers 410 may be exposed through the through hole. In some embodiments, the etching process for etching the substrate 100 may include an anisotropic etching process. In some implementations, the etching process for etching the substrate 100 may include a dry etching process using a fluorine-containing gas. Thereafter, a power via may be formed by filling the through hole with a conductive plug. The operation of filling the conductive plug may include a sputtering process, an operation of forming a seed metal layer, and an operation of performing an electroplating process after forming the conductive barrier layer.

Figure 13H:
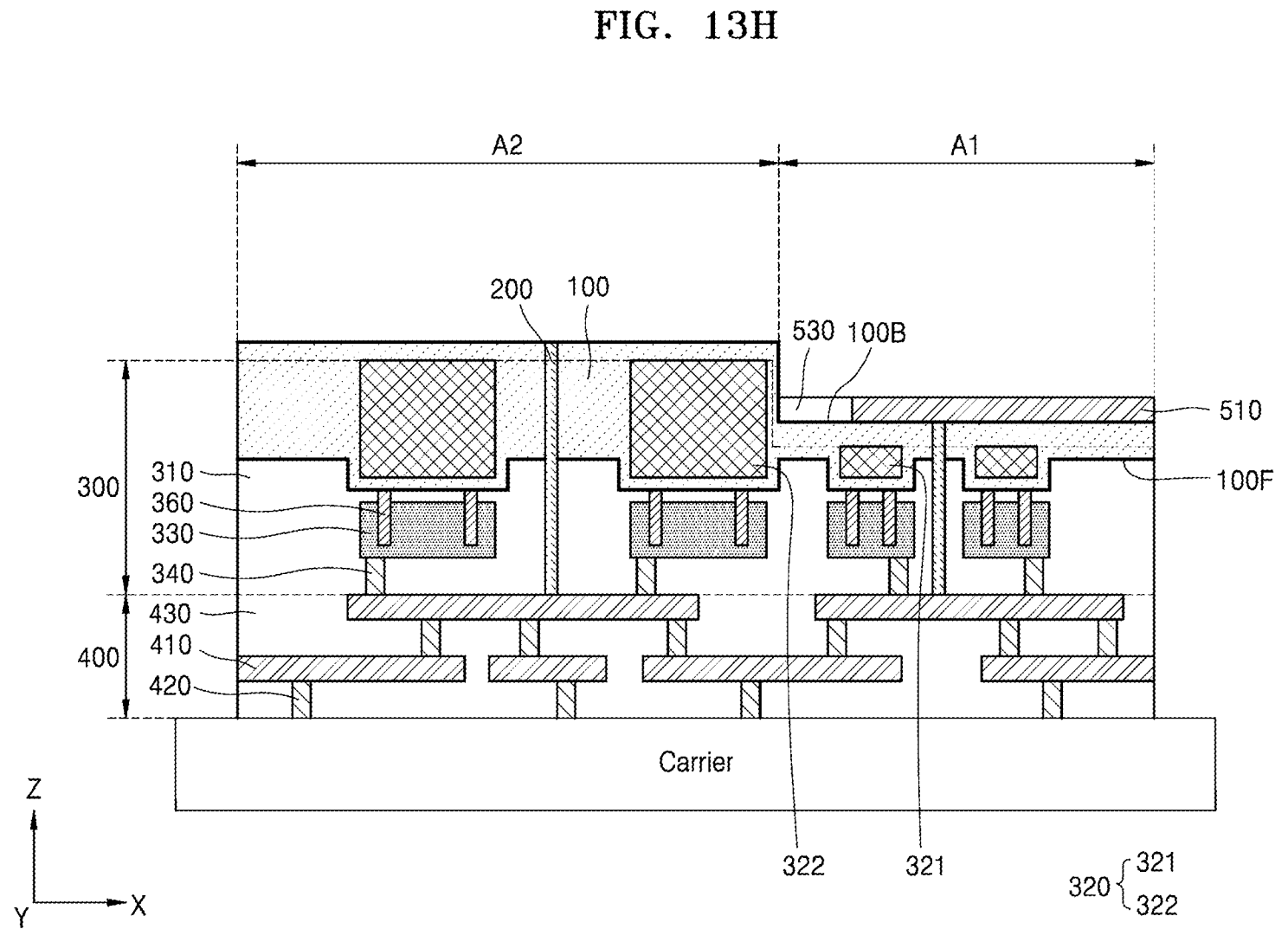
Figure 13I:
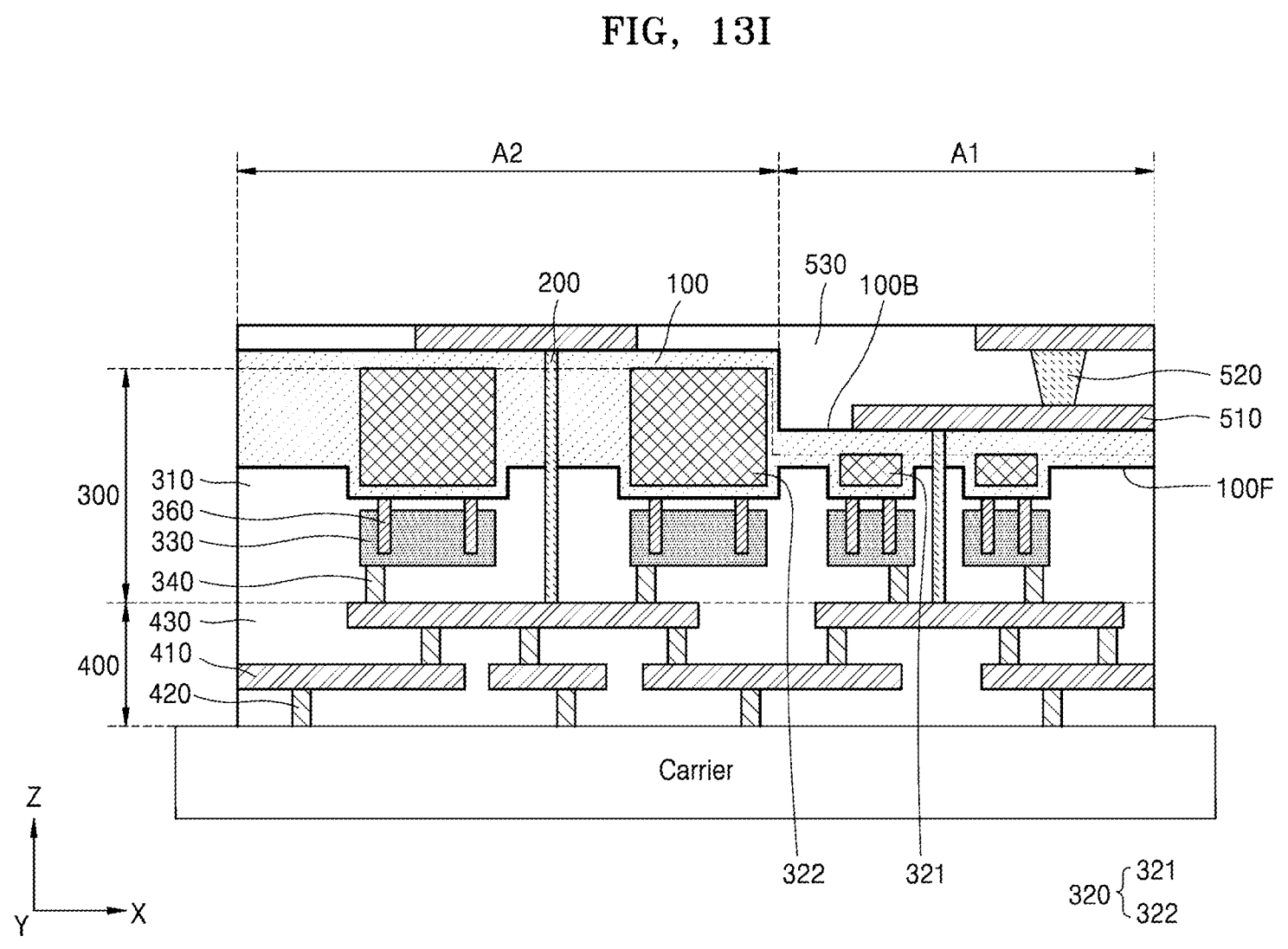
Figure 13J:
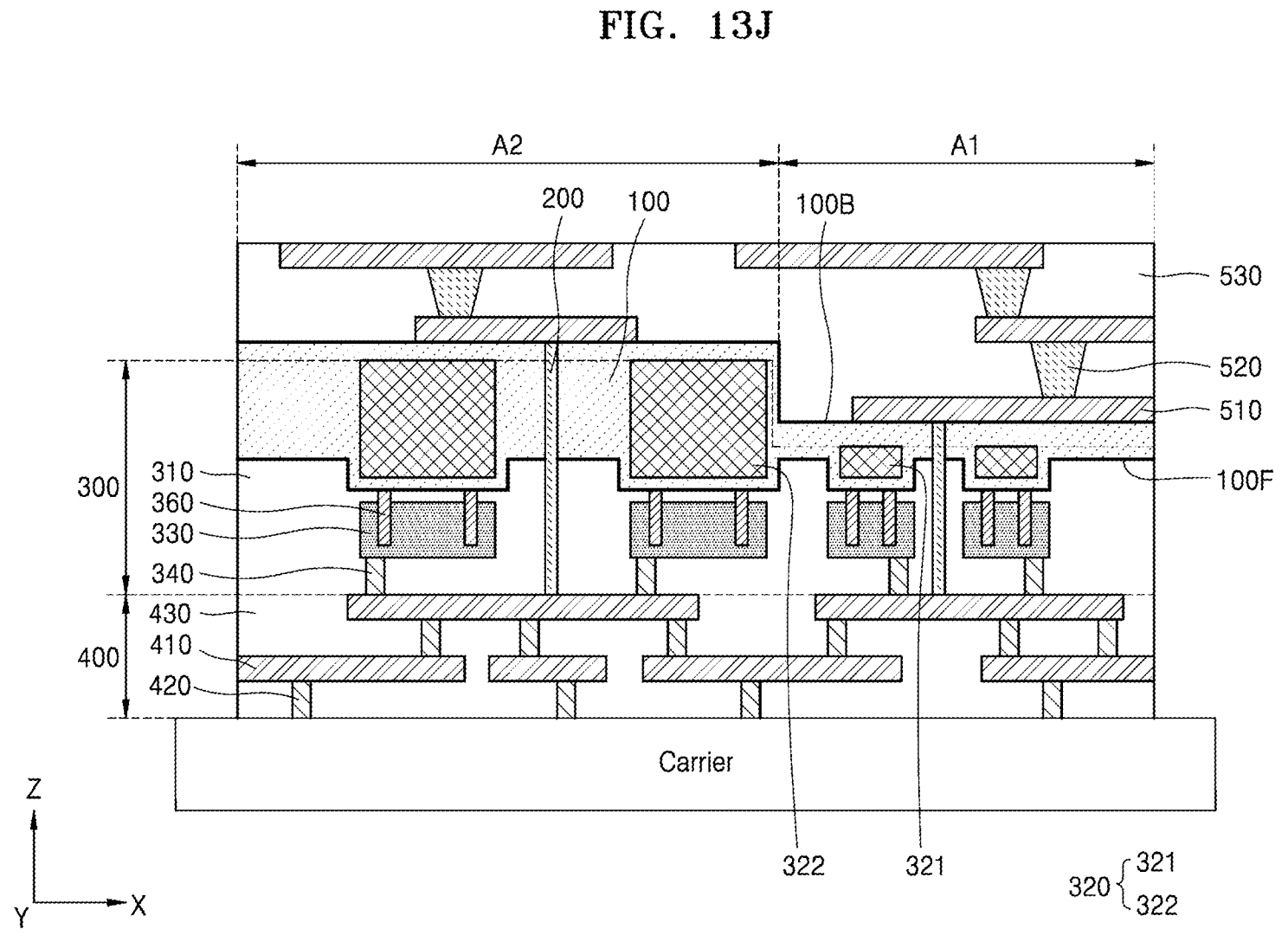

FIGS. 13H to 13J illustrate formation operations of a power transmission network part 500. In relation to the power transmission network part 500, a lower insulating layer 530 is formed on the second surface 100B of the substrate 100 on which the power via 200 is exposed, and a wiring layer adjacent to the substrate 100 among the lower multilayer wiring layers 510 in contact with the power via 200 may be patterned. After that, the operation of forming the lower via 520 and the operation of forming the lower wiring layer in the wiring layer adjacent to the substrate 100 among the lower multilayer wiring layers 510 may be repeated, such that a lower multilayer wiring layer 510 and a plurality of lower vias 520 may be formed. The lower multilayer wiring layer 510 may be electrically connected to the power via 200.

Figure 13K:
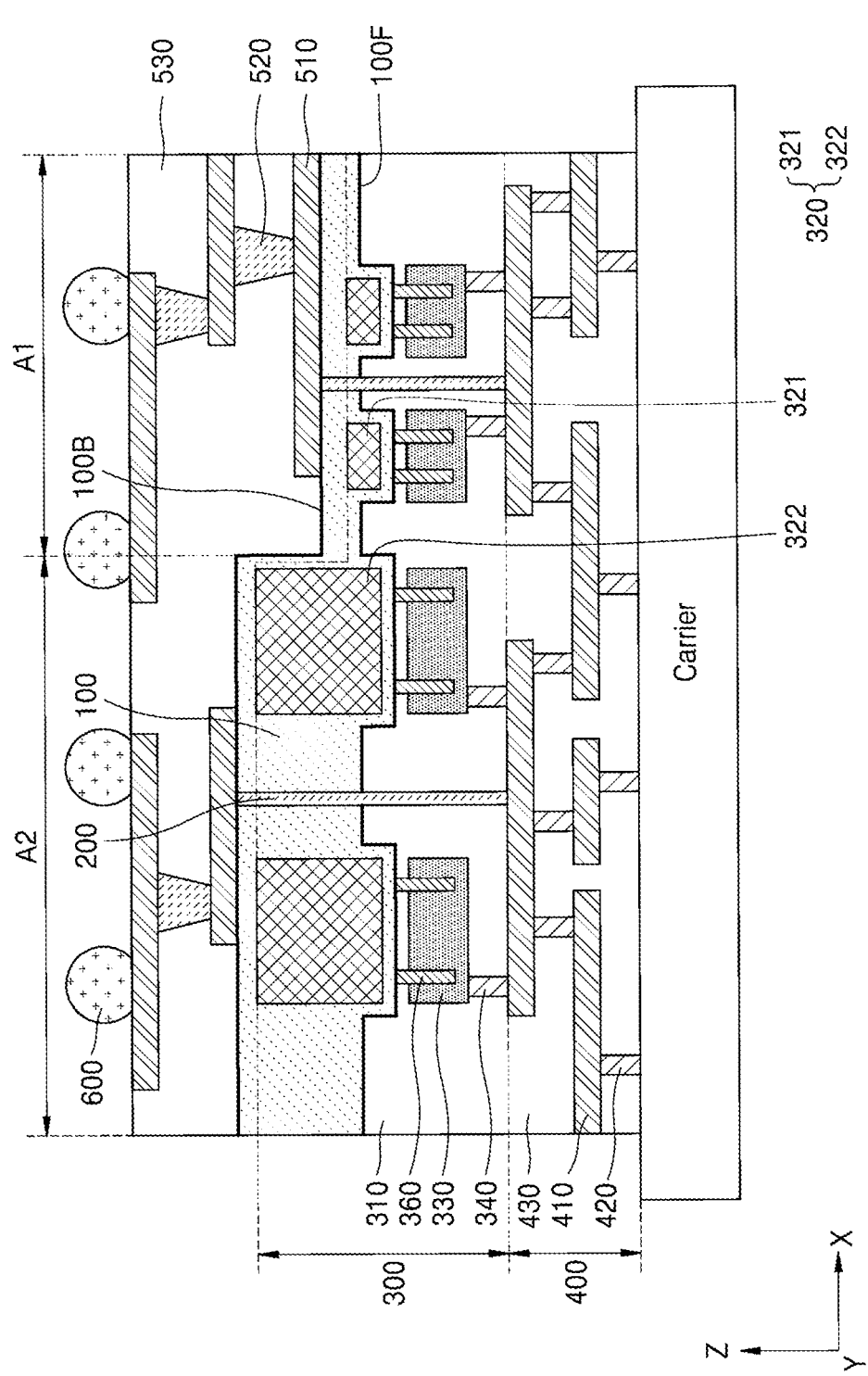
Figure 13L:
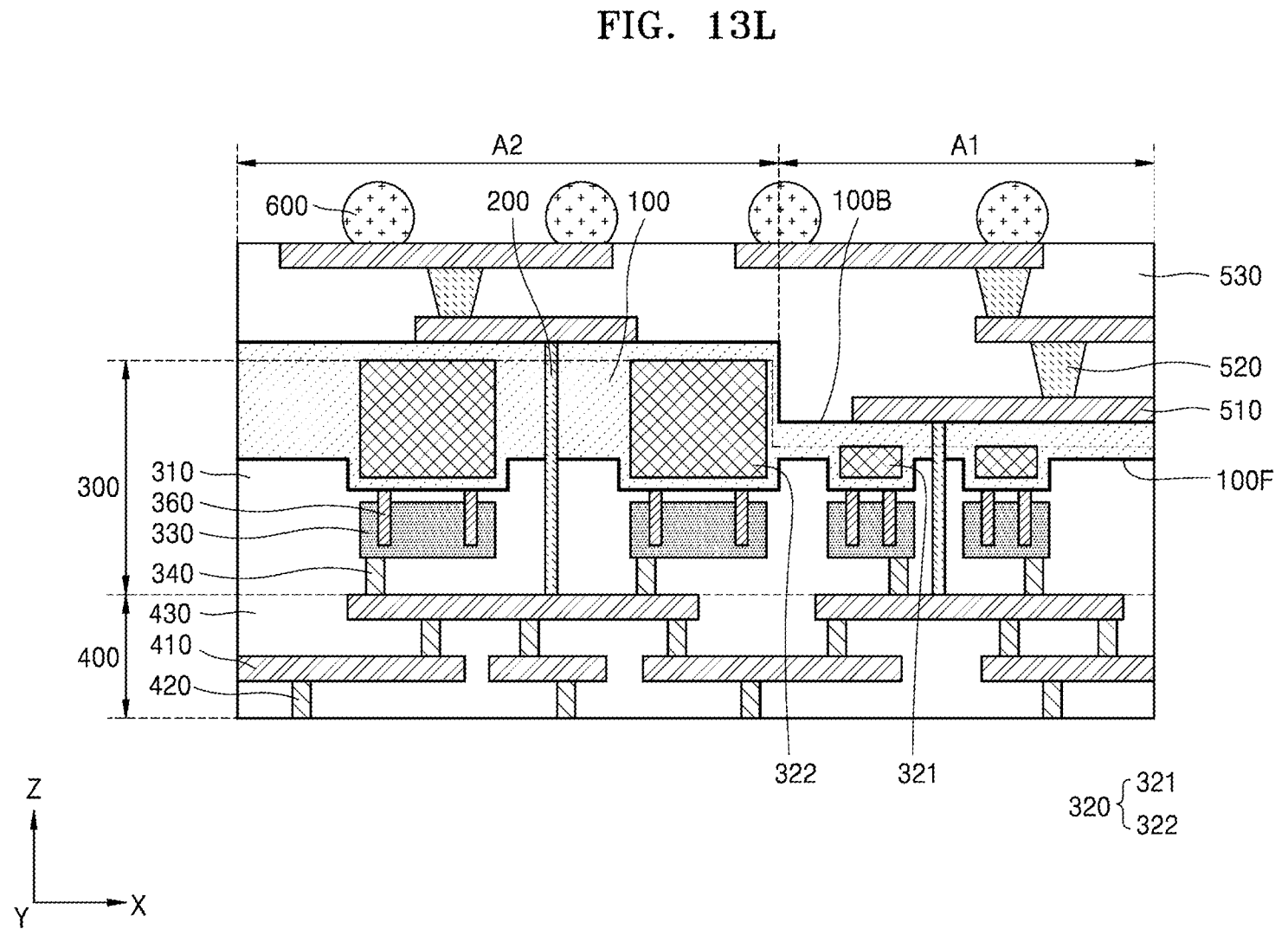

FIG. 13K illustrates an operation for connecting the external connection terminal 600 to the power transmission network part 500. FIG. 13L illustrates an operation for removing a carrier from the signal wiring part 400. Power may be transmitted to the power transmission network part 500 through the external connection terminal 600, and the power transmission network part 500 may transmit power to the individual elements 320 through the power via 200 and the signal wiring part 400.

One or more embodiments may provide an integrated circuit semiconductor device with improved power transmission noise.

One or more embodiments may provide an integrated circuit semiconductor device having an improved aspect ratio of vias.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An integrated circuit semiconductor device, comprising:
a substrate having a first surface and a second surface opposite to the first surface;
a power via penetrating between the first surface and the second surface of the substrate;
a cell part including a plurality of individual elements having different thicknesses inside the substrate; and a recess between the individual elements;
a signal wiring part on the first surface of the substrate and including an upper multilayer wiring layer connected to the power via;
a power transmission network part under the second surface of the substrate and including a lower multilayer wiring layer connected to the power via; and
an external connection terminal under the power transmission network part and connected to the lower multilayer wiring layer,
wherein the substrate includes a plurality of regions having different thicknesses.

2. The integrated circuit semiconductor device as claimed in claim 1, wherein:
the substrate includes a first region in which a first individual element of the cell part is positioned and a second region in which a second individual element of the cell part is positioned, and
a dopant depth of the second individual element is greater than a dopant depth of the first individual element.

3. The integrated circuit semiconductor device as claimed in claim 2, wherein:
the cell part includes a first recess positioned in the first region and a second recess positioned in the second region,
the first region of the substrate has a first thickness from a lower surface of the first recess to the second surface of the substrate and the second region of the substrate has a second thickness from a lower surface of the second recess to the second surface of the substrate, and the second thickness of the second region is greater than the first thickness of the first region.

4. The integrated circuit semiconductor device as claimed in claim 3, wherein:
the first thickness of the first region is from about 100 nm to about 350 nm, and
the second thickness of the second region is at least about 100 nm greater than the first thickness of the first region.

5. The integrated circuit semiconductor device as claimed in claim 1, wherein:
the cell part further includes a nanosheet, a local interconnect, and a cell via,
the nanosheet connects the individual elements to the local interconnect, and
the cell via connects the local interconnect to the upper multilayer wiring layer of the signal wiring part.

6. The integrated circuit semiconductor device as claimed in claim 1, wherein:
the cell part includes a horizontal transistor and a vertical transistor,
the substrate includes a first region in which the horizontal transistor of the cell part is positioned and a second region in which the vertical transistor of the cell part is positioned,
the cell part includes a first recess in the first region and a second recess in the second region,
the first region of the substrate has a first thickness from a lower surface of the first recess to the second surface of the substrate, and the second region of the substrate has a second thickness from a lower surface of the second recess to the second surface of the substrate, and
the second thickness of the second region is greater than the first thickness of the first region.

7. The integrated circuit semiconductor device as claimed in claim 6, wherein:
the first thickness of the first region is from about 100 nm to about 350 nm,
the second thickness of the second region is at least about 100 nm greater than the first thickness of the first region.

8. The integrated circuit semiconductor device as claimed in claim 1, wherein the cell part includes a plurality of memory devices having different thicknesses.

9. The integrated circuit semiconductor device as claimed in claim 8, wherein:
the plurality of memory devices includes a first memory device and a second memory device,
a thickness of the second memory device of the cell part is greater than a thickness of the first memory device of the cell part,
the substrate includes a first region in which the first memory device of the cell part is positioned and a second region in which the second memory device of the cell part is positioned,
the cell part includes a first recess positioned in the first region and a second recess positioned in the second region,
the first region of the substrate has a first thickness from a lower surface of the first recess to the second surface of the substrate and the second region of the substrate has a second thickness from a lower surface of the second recess to the second surface of the substrate, and
the second thickness of the second region is greater than the first thickness of the first region.

10. The integrated circuit semiconductor device as claimed in claim 1, wherein:

the cell part includes a buried conductive line and a protruding conductive line, and the power via is connected to at least one of the buried conductive line and the protruding conductive line of the cell part.

11. The integrated circuit semiconductor device as claimed in claim 1, wherein the power via is one of a plurality of power vias penetrating between the first surface and the second surface, and wherein the plurality of power vias have different horizontal widths.

12. The integrated circuit semiconductor device as claimed in claim 11, wherein:

the substrate includes a first region in which a first individual element of the cell part is positioned and a second region in which a second individual element of the cell part is positioned, a thickness of the second individual element is greater than a thickness of the first individual element, the plurality of power vias comprise a first power via having a first width and a second power via having a second width, and the first power via passes through the first region of the substrate, and the second power via passes through the second region of the substrate.

13. The integrated circuit semiconductor device as claimed in claim 12, wherein the second width of the second power via is greater than the first width of the first power via.

14. The integrated circuit semiconductor device as claimed in claim 13, wherein:

the first width of the first power via is about 50 nm to about 100 nm, and the second width of the second power via is about 200 nm to about 700 nm.

15. The integrated circuit semiconductor device as claimed in claim 12, wherein:

the cell part includes a first recess positioned in the first region and a second recess positioned in the second region, the first region of the substrate has a first thickness from a lower surface of the first recess to the second surface of the substrate the second region of the substrate has a second thickness from a lower surface of the second recess to the second surface of the substrate, and the second thickness of the second region is greater than the first thickness of the first region.

16. The integrated circuit semiconductor device as claimed in claim 15, wherein:

the first thickness of the first region of the substrate is from about 100 nm to about 350 nm, and the second thickness of the second region of the substrate is at least about 100 nm greater than the first thickness of the first region.

17. The integrated circuit semiconductor device as claimed in claim 11, wherein:

the cell part includes a horizontal transistor and a vertical transistor, the substrate includes a first region in which the horizontal transistor of the cell part is positioned and a second region in which the vertical transistor of the cell part is positioned, the plurality of power vias comprise a first power via having a first width and a second power via having a second width, the second width of the second power via is greater than the first width of the first power via, and the first power via passes through the first region of the substrate, and the second power via passes through the second region of the substrate.

18. The integrated circuit semiconductor device as claimed in claim 11, wherein:

the cell part includes a plurality of memory devices, the plurality of memory devices include a first memory device and a second memory device, a thickness of the second memory device of the cell part is greater than a thickness of the first memory device of the cell part, the substrate includes a first region in which the first memory device of the cell part is positioned and a second region in which the second memory device of the cell part is positioned, the plurality of power vias include a first power via having a first width and a second power via having a second width, the second width of the second power via is greater than the first width of the first power via, and the first power via passes through the first region of the substrate, and the second power via passes through the second region of the substrate.

19. The integrated circuit semiconductor device as claimed in claim 11, wherein the plurality of power vias have a shape in which a horizontal width thereof narrows toward the first surface of the substrate.

20. The integrated circuit semiconductor device as claimed in claim 1, wherein the substrate includes a first region in which a first individual element of the cell part is positioned and a second region in which a second individual element of the cell part is positioned, wherein a thickness of the second individual element of the cell part is greater than a thickness of the first individual element of the cell part, wherein the cell part includes a first recess positioned in the first region and a second recess positioned in the second region, wherein the first region of the substrate has a first thickness from a lower surface of the first recess to the second surface of the substrate, wherein the second region of the substrate has a second thickness from a lower surface of the second recess to the second surface of the substrate, wherein the first thickness of the first region of the substrate is from about 100 nm to about 350 nm, and the second thickness of the second region of the substrate is at least about 100 nm greater than the first thickness, wherein the power via is one of a plurality of power vias that include a first power via having a first width and a second power via having a second width, and the first power via passes through the first region of the substrate and the second power via passes through the second region of the substrate, and wherein the first width of the first power via is about 50 nm to about 100 nm, and the second width of the second power via is about 200 nm to about 700 nm.

* * * * *